United States Patent
Bassa et al.

(10) Patent No.: US 11,152,079 B2
(45) Date of Patent: Oct. 19, 2021

(54) CIRCUITS AND METHODS FOR RELIABLE REPLACEMENT OF BAD COLUMNS IN A MEMORY DEVICE

(71) Applicant: SanDisk Technologies LLC, Addison, TX (US)

(72) Inventors: Siddarth Naga Murty Bassa, San Jose, CA (US); Yenlung Li, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 49 days.

(21) Appl. No.: 16/824,362

(22) Filed: Mar. 19, 2020

(65) Prior Publication Data

US 2021/0295945 A1    Sep. 23, 2021

(51) Int. Cl.
 *G11C 29/00* (2006.01)
 *G11C 29/44* (2006.01)
 *G11C 29/24* (2006.01)

(52) U.S. Cl.
 CPC .............. *G11C 29/76* (2013.01); *G11C 29/24* (2013.01); *G11C 29/44* (2013.01); *G11C 29/785* (2013.01)

(58) Field of Classification Search
 CPC .................................................... G11C 29/76
 See application file for complete search history.

(56) References Cited

U.S. PATENT DOCUMENTS

| 9,076,506 B2 | 7/2015 | Tsai |
| 9,748,001 B2 | 8/2017 | Li et al. |
| 10,120,816 B2 | 11/2018 | Li et al. |
| 10,803,974 B1* | 10/2020 | Tang ................. G11C 29/4401 |
| 2009/0040825 A1* | 2/2009 | Adusumilli .......... G11C 29/846 365/185.09 |
| 2014/0241059 A1* | 8/2014 | Martinozzi ............ G11C 29/76 365/185.09 |

OTHER PUBLICATIONS

U.S. Appl. No. 16/239,517, filed Jan. 3, 2019.
U.S. Appl. No. 16/354,004, filed Mar. 14, 2019.

* cited by examiner

*Primary Examiner* — Douglas King
(74) *Attorney, Agent, or Firm* — Vierra Magen Marcus LLP

(57) ABSTRACT

An apparatus includes nonvolatile memory cells arranged in columns including a plurality of redundant columns with control circuits coupled to the nonvolatile memory cells. The control circuits are configured to maintain an ordered list of bad columns replaced by redundant columns. The control circuits are configured to detect an out-of-order entry in the ordered list of bad columns replaced by redundant columns.

20 Claims, 19 Drawing Sheets

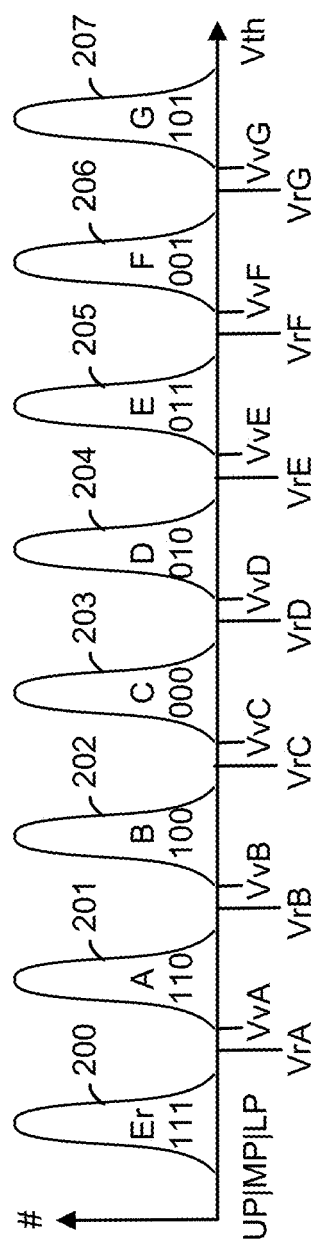

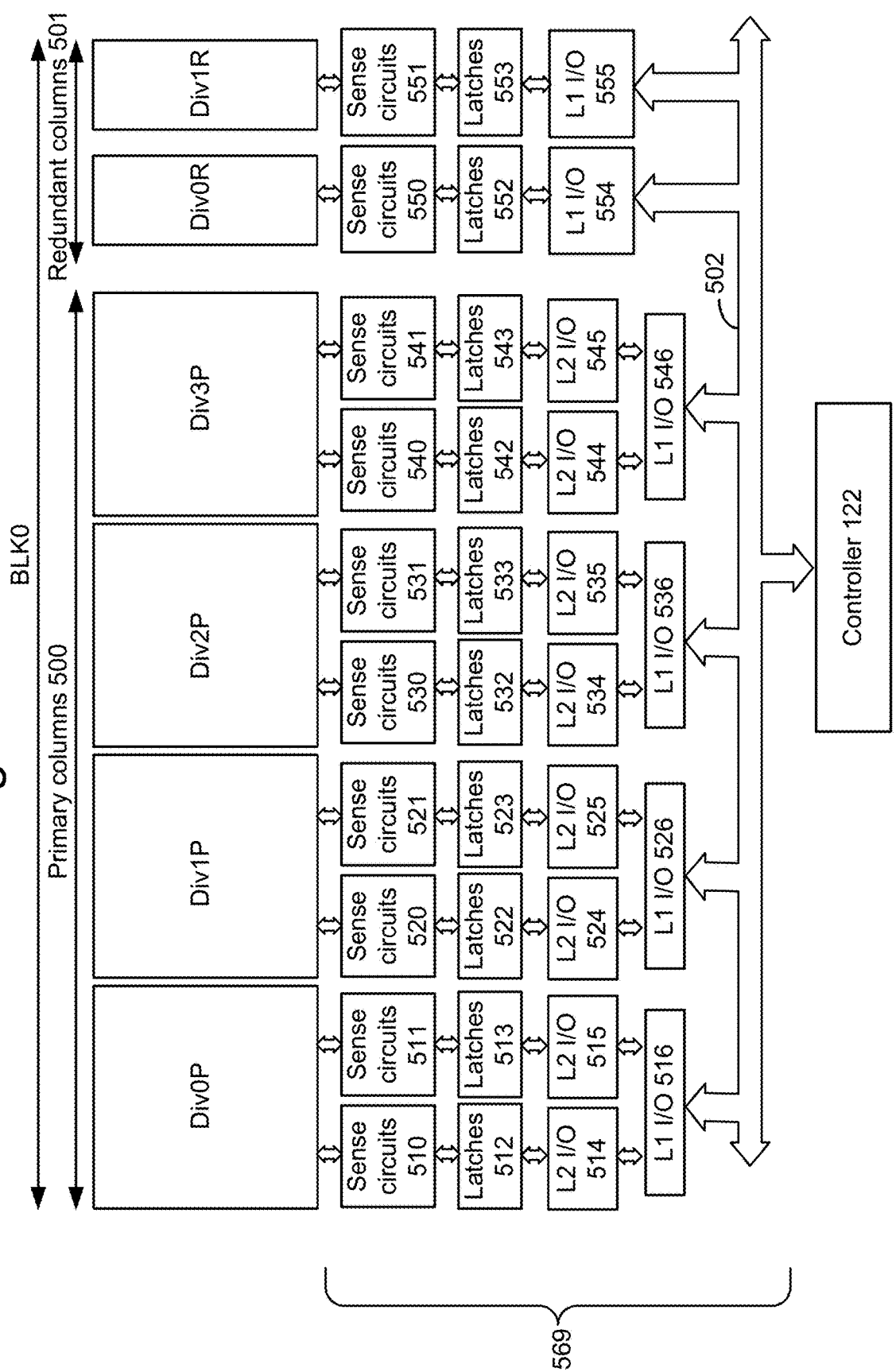

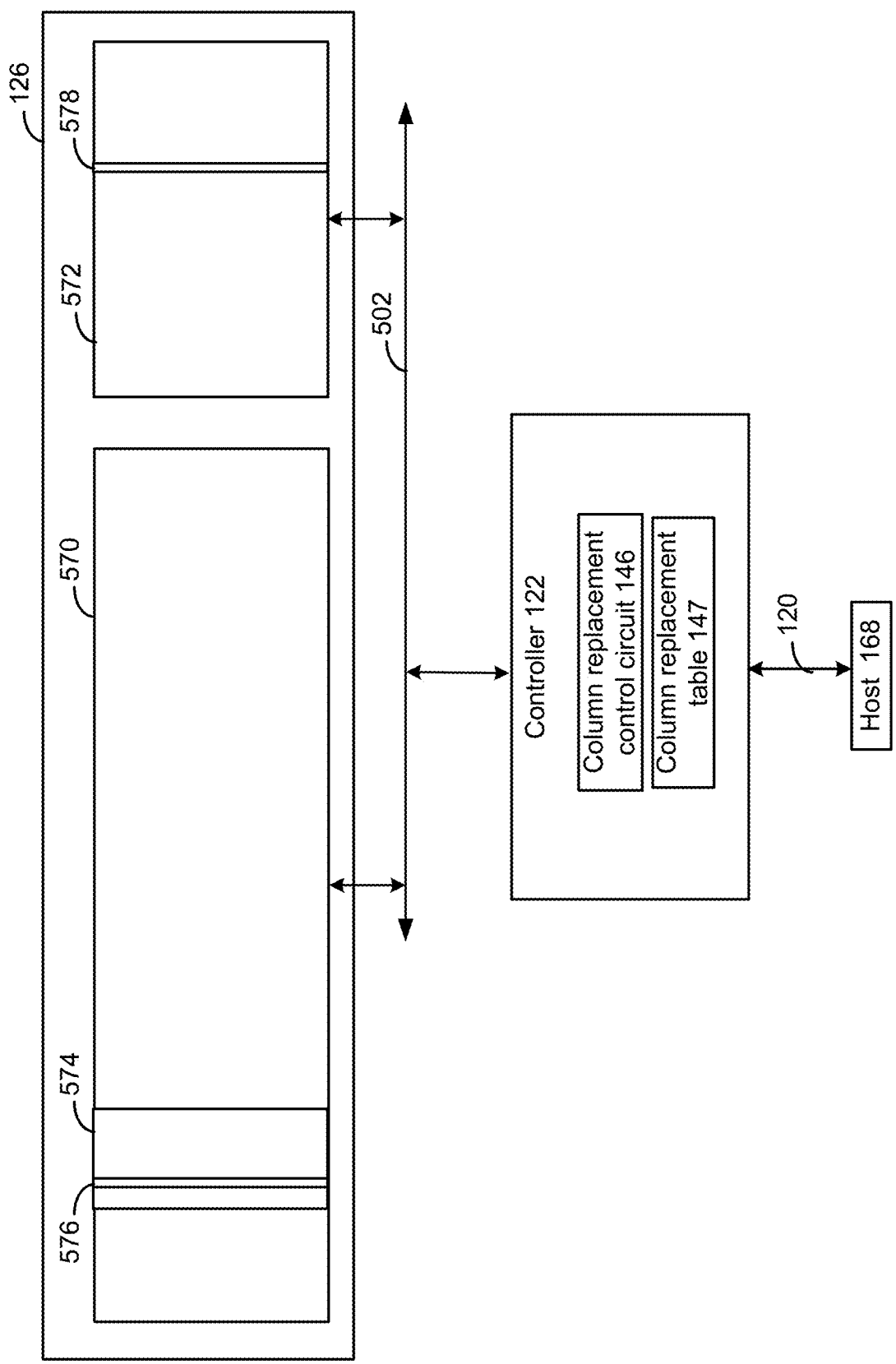

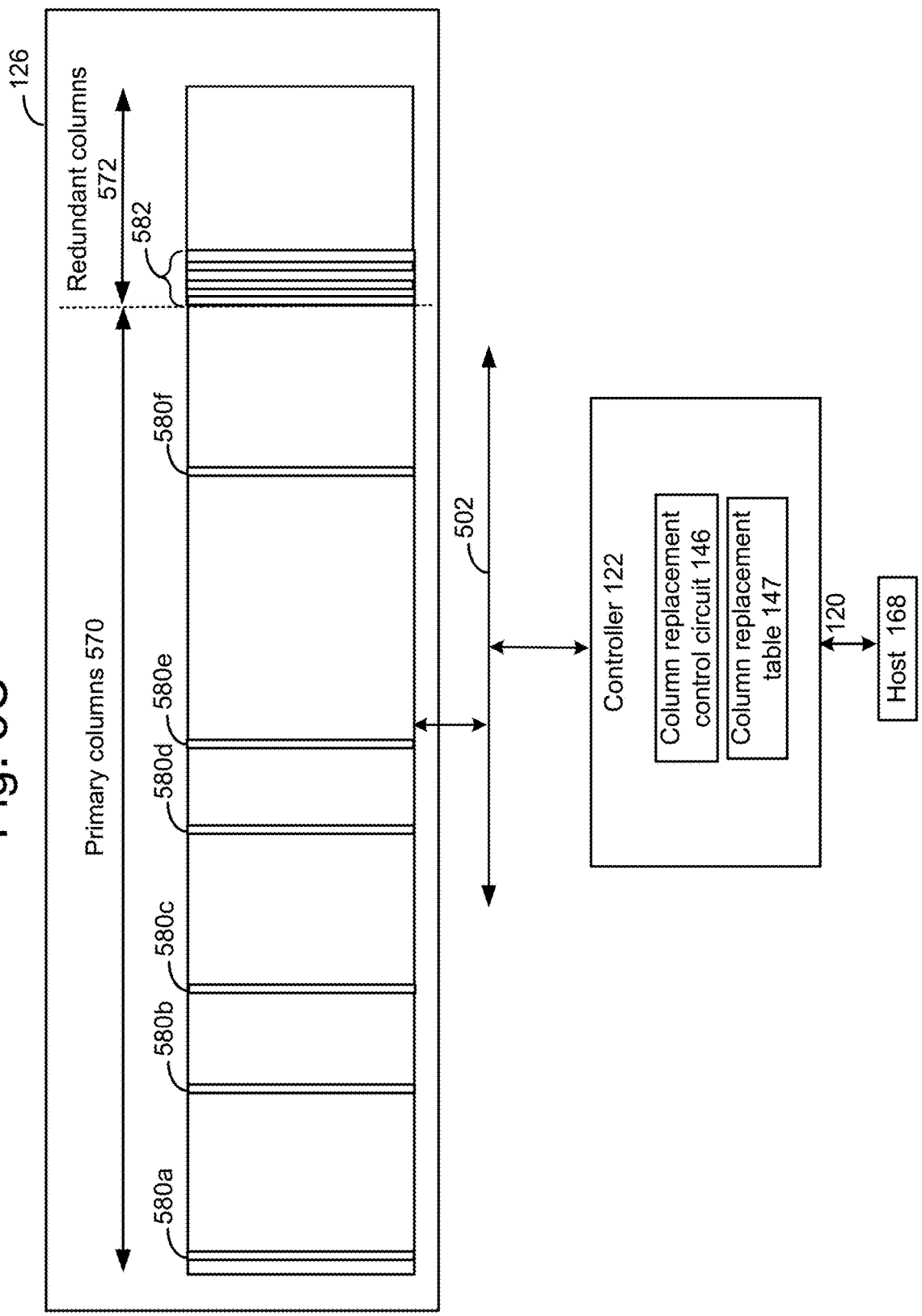

Fig. 6A

| CRD# | CRD ADDRESS |
|---|---|
| . | . |
| n-1 | 0x0100 |
| n | 0x0200 |
| n+1 | 0x0205 |
| . | . |

Fig. 6B

| CRD# | CRD ADDRESS |
|---|---|
| . | . |
| n-1 | 0x0100 |
| n | 0x0300 |
| n+1 | 0x0205 |
| . | . |

Fig. 6C

| CRD# | CRD ADDRESS |
|---|---|
| . | . |
| n-1 | 0x0100 |
| n | 0x0000 |
| n+1 | 0x0205 |
| . | . |

Fig. 7A

| Logical column address | 0 | 1 | 2 | 3 | 4 | 5 | 6 | 7 | 8 | 9 | 10 | 11 | 12 |
|---|---|---|---|---|---|---|---|---|---|---|---|---|---|
| Data Input | A | B | C | x | D | E | F | G | x | H | I | J | K |
| Data Output | A | B | C | x | D | E | F | G | x | H | I | J | K |
| Expected Data | A | B | C | x | D | E | F | G | x | H | I | J | K |

Fig. 7B

| Logical column address | 0 | 1 | 2 | 3 | 4 | 5 | 6 | 7 | 8 | 9 | 10 | 11 | 12 |
|---|---|---|---|---|---|---|---|---|---|---|---|---|---|
| Data Input | A | B | C | x | D | E | F | G | x | H | I | J | K |
| Data Output | A | B | C | x | D | E | F | G | x | H | I | J | K |
| Expected Data | A | B | C | D | E | F | G | H | I | J | K | L | M |

Misaligned by 1 column address (columns 3–7)

Misaligned by 2 column addresses (columns 8–12)

Fig. 11

| Logical column address | 0 | 1 | 2 | 3 | 4 | 5 | 6 | 7 | 8 | 9 | 10 | 11 | 12 |
|---|---|---|---|---|---|---|---|---|---|---|---|---|---|
| Data Input | A | B | C | x | D | E | F | G | x | H | I | J | K |
| Data Output | A | B | C | x | D | E | F | G | x | H | I | J | K |
| Expected Data | A | B | C | D | E | F | G | H | | | I | J | K |

Columns 4–7: Misaligned by 1 column address
Columns 8–9: Skip 2 columns
Columns 10–12: Realigned

Fig. 12A

| Logical column address | 0 | 1 | 2 | 3 | 4 | 5 | 6 | 7 | 8 | 9 | 10 | 11 | 12 |
|---|---|---|---|---|---|---|---|---|---|---|---|---|---|
| Data Output | A | B | C | D | E | F | G | H | I | J | K | L | M |
| Expected Data | A | B | C | D | E | F | G | H | I | J | K | L | M |

| D | I |
|---|---|

Not found in table → ;  No match - Pointer stuck →

| Logical column address | 0 | 1 | 2 | 3 | 4 | 5 | 6 | 7 | 8 | 9 | 10 | 11 | 12 |
|---|---|---|---|---|---|---|---|---|---|---|---|---|---|
| Data Output | A | B | C | x | E | F | G | H | x | J | K | L | M |
| Expected Data | A | B | C | D | E | F | G | H | I | J | K | L | M |

| D | I |
|---|---|

1228

CIRCUITS AND METHODS FOR RELIABLE REPLACEMENT OF BAD COLUMNS IN A MEMORY DEVICE

BACKGROUND

The present technology relates to the operation of storage and memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device can include memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 2A depicts example write data in the latches 194-197 of FIG. 1B in a program operation.

FIG. 2B depicts a threshold voltage distribution of a set of memory cells, using eight data states, consistent with FIG. 2A.

FIG. 5A depicts an example configuration of the block BLK0 of FIG. 4 and associated access circuitry 569, where the NAND strings are arranged in divisions for primary columns and redundant columns.

FIG. 5B illustrates an example configuration of primary columns, redundant columns and control circuitry.

FIG. 5C illustrates another example configuration of primary columns, redundant columns and control circuitry.

FIGS. 6A-C illustrate examples of entries in a column replacement table.

FIGS. 7A-B illustrate a column replacement scheme that uses column skipping.

FIG. 11 illustrates an example of a column skip scheme modified in response to an out-of-order entry.

FIGS. 12A-C illustrate examples of a bad column multiplexing scheme and modification in response to an out-of-order entry.

DETAILED DESCRIPTION

Apparatuses and techniques are described for accessing replacement columns (redundant columns) in a memory device. Where accessing replacement columns uses a column replacement table, an erroneous address obtained from such a table may cause a bad column to be treated as a good column so that bad data is obtained. In some bad column replacement schemes, this can also affect subsequent data obtained from subsequent columns (e.g. misalignment of data) which may result in a large amount of unusable data being read from memory due to an erroneous address obtained from a column replacement table. Where a column replacement table includes an ordered list of bad columns, an erroneous address may cause a pointer to become stuck so that subsequent column replacement is not performed resulting in significant errors.

Where a column replacement table includes an ordered list of bad columns, an erroneous address may be out-of-order with addresses of one or more adjacent entry. Detecting such out-of-order entries may allow detection of erroneous entries so that appropriate action can be taken. Addresses can be compared directly or may be compared by seeing when addresses first match with an internal address as the internal address is incremented (e.g. as the internal address increases, lower address matches first). An out-of-order entry may be detected from a match that occurs out of an expected order.

A response to an out-of-order entry may include forcing a pointer to advance to a higher entry (subsequent entry in ascending order) so that the pointer is not stuck at the out-of-order entry. This may allow column replacement to proceed for subsequent columns. An output signal may be generated to indicate an out-of-order condition. The signal may be provided to external test equipment, used to record the out-of-order condition (e.g. in an error log), used to trigger modification of a column replacement scheme (e.g. in a column skip scheme, an out-of-order entry may indicate failure to skip a bad column and in response another column may be skipped to realign data).

Figure 4:
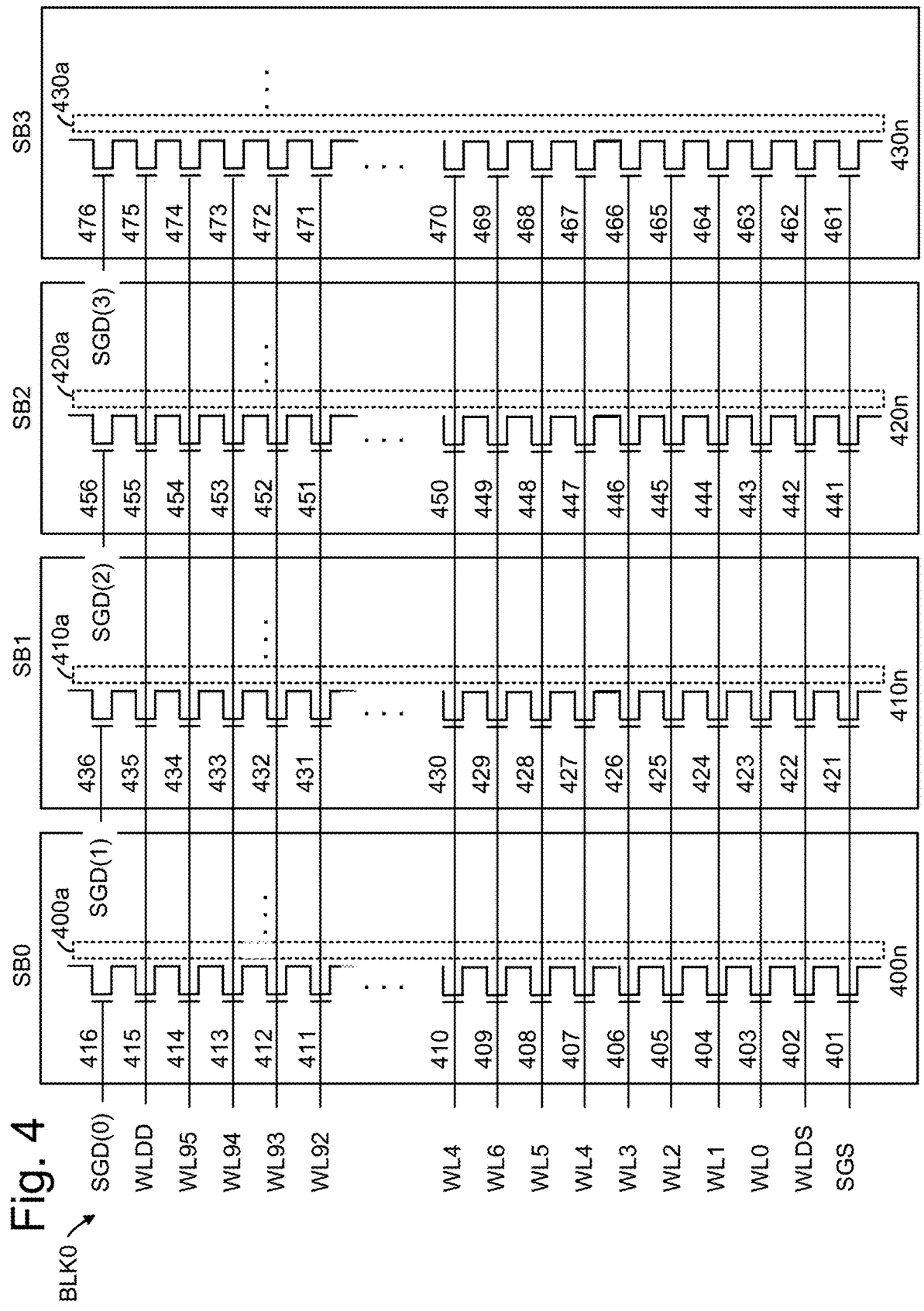
FIG. 4 depicts an example view of NAND strings in a block BLK0 in the memory structure 126 of FIG. 1.

In some memory devices, memory cells are joined to one another such as in NAND strings in a block or sub-block. Referring to FIG. 4, for example, each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells, which is connected to a source line. Further, the memory cells can be arranged with a common control gate line (e.g., word line) which acts a control gate. A set of word lines extends from the source-side of a block to the drain-side of a block. Memory cells can be connected in other types of strings and in other ways as well.

For example, in a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate.

After a block of memory cells is erased in an erase operation, programming can occur. During a programming operation, the memory cells are programmed according to a word line programming order. For example, the programming may start at the word line at the source-side of the block and proceed to the word line at the drain-side of the block, one word line at a time. A word line can also be programmed in a sub-block programming order, extending from SB0 to SB3, for example, when there are four sub-blocks (FIG. 4). For example, a portion of the memory cells of WLn in SB0 are first programmed, followed by a portion of the memory cells of WLn in SB1, a portion of the memory cells of WLn in SB2 and then a portion of the memory cells of WLn in SB3. A programming operation may include one or more sets of increasing program voltages or pulses which are applied to a word line in respective program loops or program-verify iterations. Verify tests may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three programmed data states referred to as the A, B and C data states. In a three-bit per cell memory device, there are eight data states including the erased state and seven programmed data states referred to as the A, B, C, D, E, F and G data states (see FIG. 2B). In a four-bit per cell memory device, there are sixteen data states, including the erased state S0 and fifteen programmed data states S1-S15. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn. A read operation can involve reading pages of data, one at a time. See FIG. 2A.

Each block of memory cells is typically tested at the time of manufacture, before being shipped to the end user, to identify defective (bad) NAND strings which are not suitable for storing data. Defects, including, e.g., short circuits, can be caused by manufacturing variations and other reasons. To address this problem without having to discard an entire block when only one, or a few, NAND strings are defective, a block can include a number of redundant columns of NAND strings which substitute for defective primary columns of NAND strings. A column can represent a set of successive NAND strings such as 16 NAND strings, for example, which store a word of data. As depicted in FIGS. 5 and 6A, for example, a block BLK0 can be divided into a group of primary columns 500 and a group of redundant columns 501. If the testing indicates that a primary column of NAND strings includes a defective NAND string, that column is identified in a column replacement table 147 (FIG. 1A) as being replaced by a redundant column.

Figure 1A:
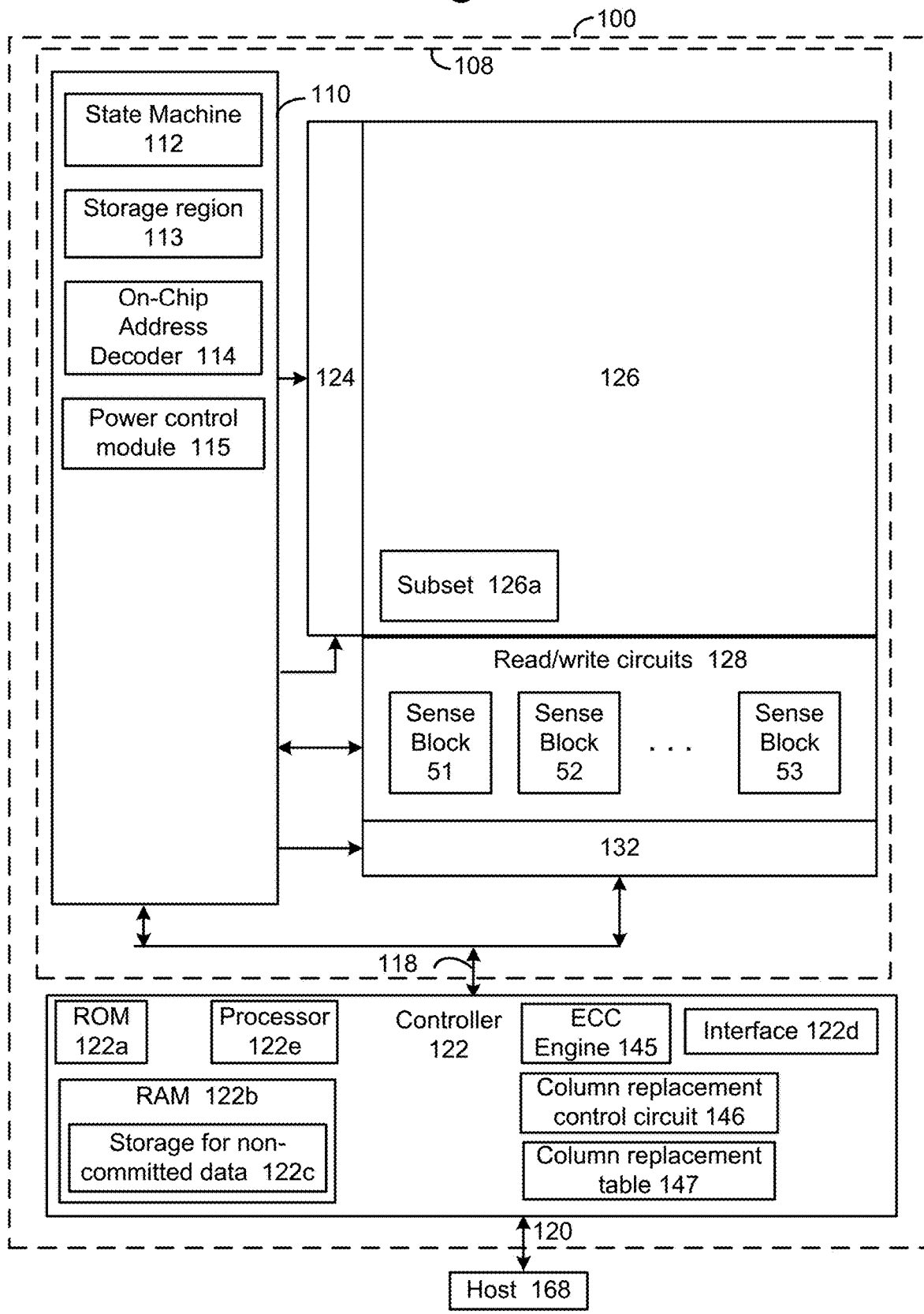
FIG. 1A is a block diagram of an example storage device.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically, a controller 122 is included in the same memory device 100 (e.g., a removable storage card) as the one or more memory die 108. The controller may be separate from the memory die (e.g. formed on a separate substrate). Commands and data are transferred between the host 168 and controller 122 via a data bus 120, and between the controller and the one or more memory die 108 via lines 118.

The memory structure 126 can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, and a power control module 115 (power control circuit). A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, sense blocks 51, 52, . . . , 53, 0read/write circuits 128, controller 122, and so forth.

The off-chip controller 122 (which in one embodiment is an electrical circuit) may comprise a processor 122e, memory such as ROM 122a and RAM 122b and an error-correction code (ECC) engine 145. The ECC engine can correct a number of read errors. The RAM 122b can be a DRAM which includes a storage location 122c for non-committed data. During programming, a copy of the data to be programmed is stored in the storage location 122c until the programming is successfully completed. In response to the successful completion, the data is erased from the storage location and is committed or released to the block of memory cells. The storage location 122c may store one or more word lines of data.

The controller may further include a column replacement control circuit 146 and a column replacement table 147. The column replacement control circuitry may include hardware, software and/or firmware for performing the processes described herein. In program and read operations, the column replacement control circuitry may access the column replacement table to identify addresses of bad, e.g., defective, columns and corresponding redundant columns which replace them. While shown as separate components, column replacement control circuitry and a column replacement table may be combined (e.g. a column replacement table may be considered part of column replacement control circuitry). While the example of FIG. 1A shows column replacement control circuit 146 and column replacement table 147 in off-chip controller 122, in other examples one or both of these components may be implemented in memory die 108 (e.g. implemented in control circuitry 110). The present technology is not limited to any particular locations for these components. In an example, column replacement table may be in the form of a one-time writable memory, e.g. Read Only Memory (ROM), that is written during or after final testing at a test facility. Column replacement may also be in the form of rewritable memory so that bad columns may be added after final testing (e.g. as defects are detected with use). In an example, column replacement table 147 is maintained in memory structure 126 (e.g. at a dedicated location) and is loaded into a volatile memory (e.g. RAM, which may be dedicated RAM or a portion of a RAM such as RAM 122b) in controller 122 when memory system 100 powers up. Structures such as ROM, a portion of memory structure 126, portion of RAM 122b or other structure used to hold a column replacement table that is ordered may be considered a means for maintaining an ordered list of bad columns of a nonvolatile memory structure that are replaced by redundant columns of the nonvolatile memory structure.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively, or additionally, the processor can access code from a subset 126a of the memory structure, such as a reserved area of memory cells in one or more word lines. Such a subset of the memory structure may also store a column replacement table.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable m devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used (e.g. memory structure 126 may be formed of other types of non-volatile memory).

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
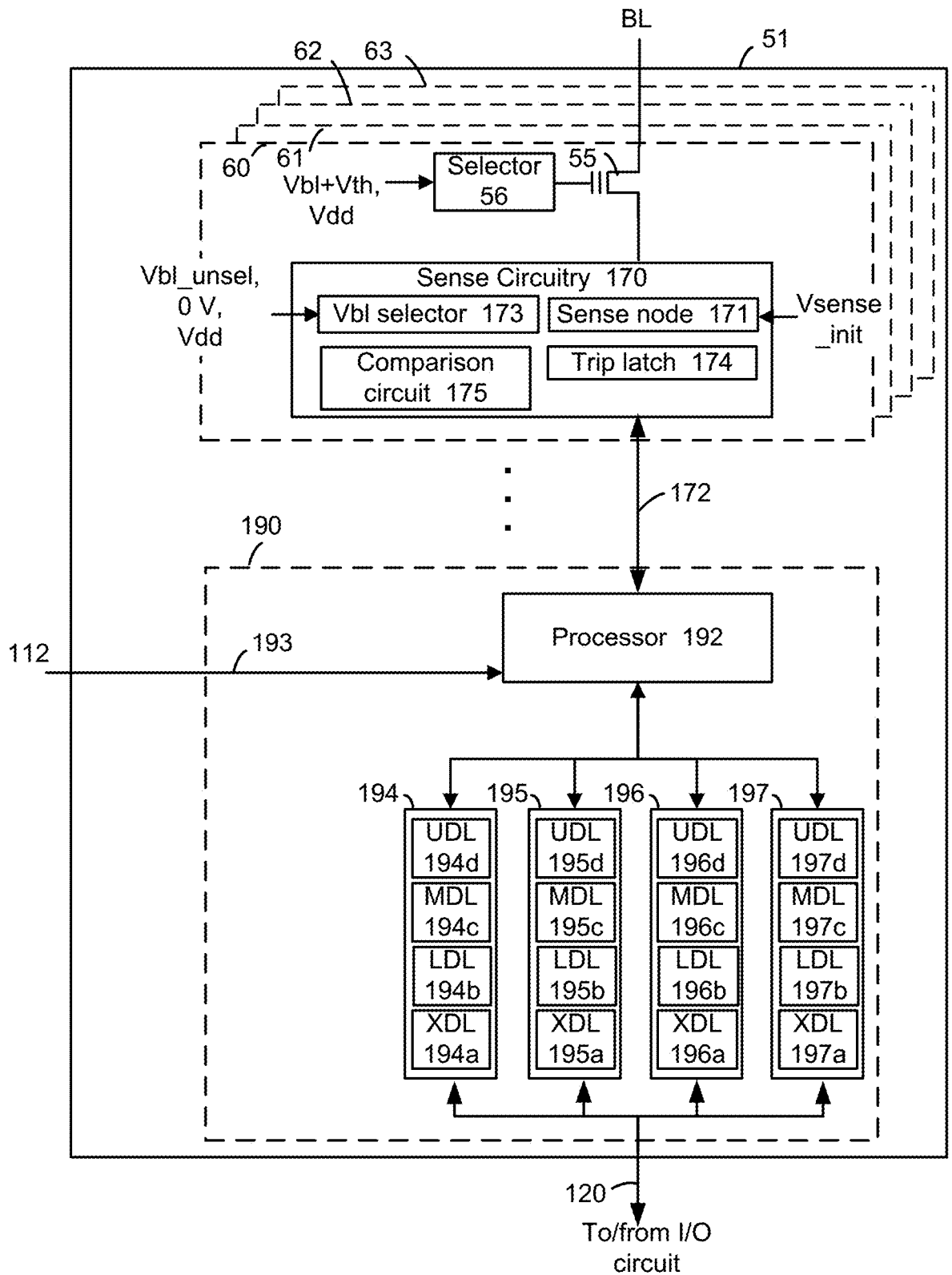
FIG. 1B is a block diagram depicting one embodiment of the sense block 51 of FIG. 1.

FIG. 1B is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vb1 selector 173, a sense node 171, a comparison circuit 175 and a trip latch 174. During the application of a program voltage, the Vb1 selector 173 can pass Vb1 unsel (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vb1 from the Vb1 selector 173, by setting the control gate voltage of the transistor sufficiently high, e.g., higher than the Vb1 passed from the Vb1 selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vb1+Vth is passed by the selector 56, the bit line voltage will be Vb1. This assumes the source line is at 0 V. The transistor 55 clamps the bit line voltage according to the control gate voltage and acts a source-follower rather than a pass gate. The Vb1 selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vb1 or Vdd. The Vb1 selector 173 of each sense circuit can also be controlled separately from the Vb1 selectors of other sense circuits.

During sensing, the sense node 171 is charged up to an initial voltage such as 3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and a data bus 120 to/from an I/O circuit. For each NAND string, a set of data latches can be provided for storing read and write data while an additional input/output latch XDL, or data transfer latch, is provided for transferring data to/from the other latches. The XDL latches may be represented by the latches 512, 513, 522, 523, 532, 533, 542, 543, 552 and 553 of FIGS. 5 and 6A. As mentioned at the outset, these latches can be reduced in size when the data rate is slowed using the techniques described herein, allowing the memory device to be scaled down.

For example, in a three bit per cell embodiment, three data latches LDL, MDL and XDL are provided for storing read and write data for each NAND string. LDL stores a bit for a lower page of data, MDL stores a bit for a middle page of data and UDL stores a bit for an upper page of data. For example, a set of latches 194 includes XDL 194a, LDL 194b, MDL 194c and UDL 194d. A set of latches 195 includes XDL 195a, LDL 195b, MDL 195c and UDL 195d. A set of latches 196 includes XDL 196a, LDL 196b, MDL 196c and UDL 196d. A set of latches 197 includes XDL 197a, LDL 197b, MDL 197c and UDL 197d.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are four data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

FIG. 2A depicts example write data in the latches 194-197 of FIG. 1B in a program operation. In this case, the memory cells each store three bits of data in one of eight data states. At the start of a program operation, the write data can be received at the XDL latch from the controller and I/O circuits and transferred from the XDL latch to the LDL, MDL and UDL latches, for each NAND string. Once the write data is stored in the latches, program pulses can be applied to the selected word line.

In a read operation, a read voltage is applied to the selected word line while the respective memory cells are sensed to obtain read data. Read data can be transferred from one or more of the LDL, MDL and UDL latches to the XDL latch, and from there to the I/O circuits and the controller, for each NAND string.

Example bit assignments for each state are depicted. A lower, middle or upper bit can represent data of a lower, middle or upper page, respectively. Seven programmed data states A, B, C, D, E, F and G are used in addition to the erased state, Er. With these bit sequences, the data of the lower page can be determined by reading the memory cells using read voltages (e.g., control gate or word line voltages) of VrA and VrE. The lower page (LP) bit=1 if Vth<=VrA or Vth>VrE. LP=0 if VrA<Vth<=VrE. Generally, a memory cell can be sensed by sense circuitry while a read voltage is applied. If the memory cell is in a conductive state, its threshold voltage (Vth) is less than the read voltage. If the memory cell is in a non-conductive state, its Vth is greater than the read voltage.

The read voltages which are used to read a page of data are determined by transitions from 0 to 1 or 1 to 0 in the encoded bits (code word) for each state. For example, the LP bit transitions from 1 to 0 between Er and A, and from 0 to 1 between D and E. Accordingly, the read voltages for the LP are VrA and VrE.

The data of the middle page can be determined by reading the memory cells using read voltages VrB, VrD and VrF. The middle page (MP) bit=1 if Vth<=VrB or VrD<Vth<=VrF. MP=0 if VrB<Vth<=VrD or Vth>VrF. For example, referring to the encoded bits of FIG. 2B to between E and F. Accordingly, the read voltages for the MP are VrB, VrD and VrF.

The data of the upper page can be determined by reading the memory cells using read voltages of VrC and VrG. The upper page (UP) bit=1 if Vth<=VrC or Vth>VrG. UP=0 if VrC<Vth<=VrG. For example, referring to the encoded bits of FIG. 2B, the UP bit transitions from 1 to 0 between B and C, and from 0 to 1 between F and G. Accordingly, the read voltages for the UP are VrC and VrG.

A read operation can involve reading one page at a time. In this case, the read data for a page is obtained by the sense circuits and stored in the XDL latches for output to a controller. As described herein, the read data for redundant columns can be buffered in a FIFO buffer before being transferred to the controller.

FIG. 2B depicts a threshold voltage (Vth) distribution of a set of memory cells, using eight data states, consistent with FIG. 2A. The Vth distribution is achieved after performing a program operation. In one approach, the program operation may use incremental step pulse programming. During the programming, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state. For example, the verify voltages of the A, B, C, D, E, F and G states are VvA, VvB, VvC, VvD, VvE, VvF and VvG, respectively. The A, B, C, D, E, F and G states are represented by the Vth distributions 201, 202, 203, 204, 205, 206 and 207, respectively, and an example encoding of bits for each state is 111, 110, 100, 000, 010, 011, 001 and 101, respectively, in the format of UP|MP|LP. The read voltages VrA, VrB, VrC, VrD, VrE, VrF and VrG, consistent with FIG. 2A, are also depicted.

Figure 3:
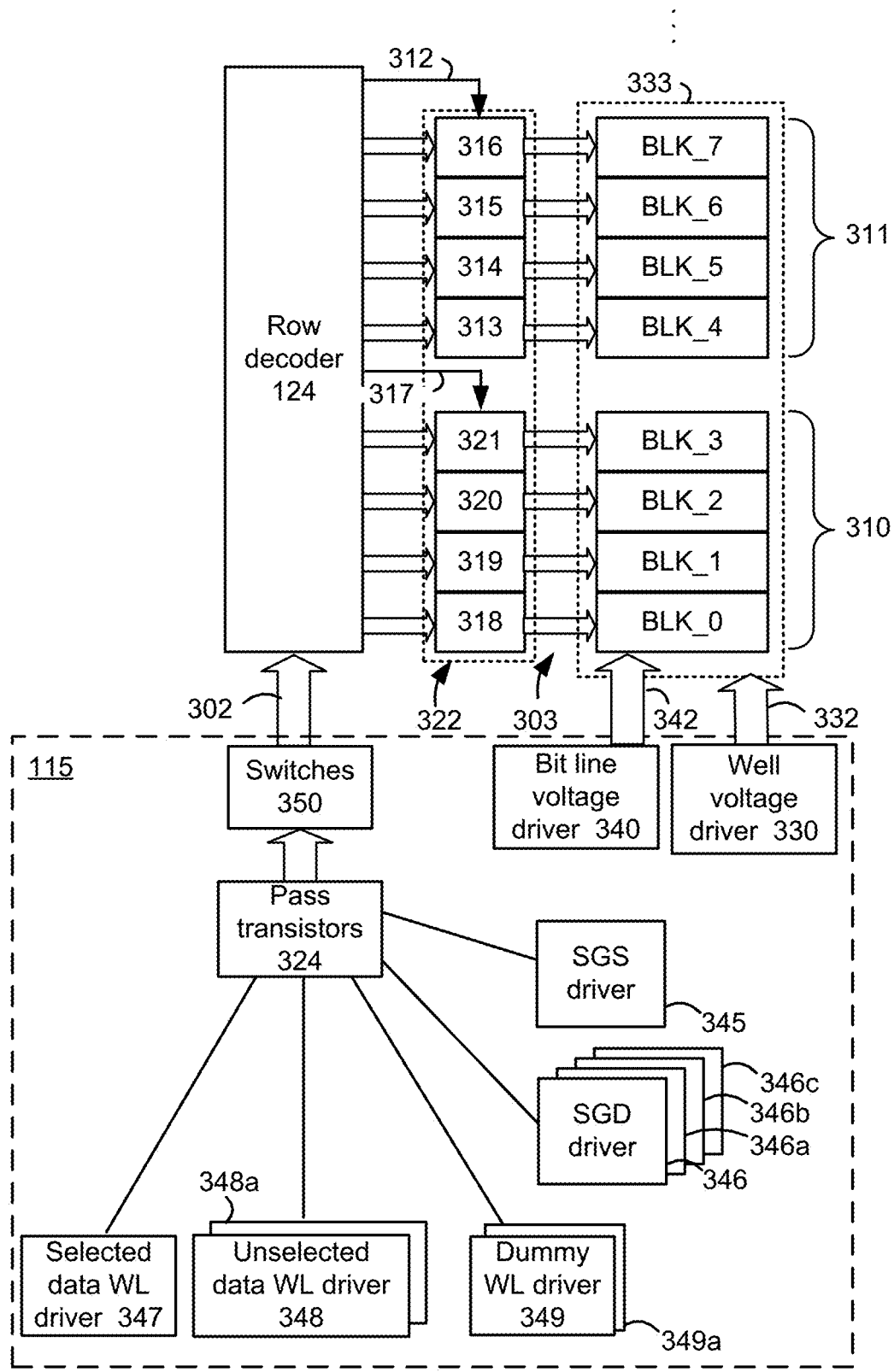
FIG. 3 depicts an example implementation of the power control module 115 of FIG. 1A for providing voltages to blocks of memory cells.

FIG. 3 depicts an example implementation of the power control module 115 of FIG. 1A for providing voltages to blocks of memory cells. In this example, the memory structure 126 includes a set 310 of four related blocks, BLK_0 to BLK_3, and another set 311 of four related blocks, BLK_4 to BLK_7. The blocks can be in one or more planes. The row decoder 124 of FIG. 1A provides voltages to word lines and select gates of each block via pass transistors 322. The row decoder provides a control signal to pass transistors which connect the blocks to the row decoder. In one approach, the pass transistors of each set of blocks are controlled by a common control gate voltage. Thus, the pass transistors for a set of blocks are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313, 314, 315 and 316, which in turn are connected to control gate lines of BLK_4, BLK_5, BLK_6 and BLK_7, respectively. A control gate line 317 is connected to sets of pass transistors 318, 319, 320 and 321, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

The voltage drivers can include a selected data word line (WL) driver 347, which provides a voltage on a data word line selected during a program or read operation. The driver 347 can provide a voltage on WLn. Drivers 348, 348a, 348b and 348c can be used for unselected data word lines, and dummy word line drivers 349 and 349a can be used to provide voltages on dummy word lines WLDD and WLDS, respectively, in FIG. 4. For example, the driver 348 can be used to apply voltages to the drain-side unselected word lines and the driver 348a can be used to apply voltages to the source-side unselected word lines.

The voltage drivers can also include separate SGD drivers for each sub-block. For example, SGD drivers 346, 346a, 346b and 346c can be provided for SB0, SB1, SB2 and SB3, respectively, such as in FIG. 4. In one option, an SGS driver 345 is common to the different sub-blocks in a block.

The various components, including the row decoder, may receive commands from a controller such as the state machine 112 or the controller 122 to perform the functions described herein.

The well voltage driver 330 provides a voltage Vs1 to a well region 333 in the substrate, via control lines 332. The well voltage driver 330 is one example of a source line driver, where the well region is a source line, e.g., a conductive path connected to the source ends of the NAND strings. In one approach, the well region is common to the blocks. A set of bit lines 342 is also shared by the blocks. A bit line voltage driver 340 provides voltages to the bit lines. In a stacked memory device sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

FIG. 4 depicts an example view of NAND strings in a block BLK0 in the memory structure 126 of FIG. 1. A block comprises a plurality of memory cells. The primary NAND strings are arranged in sub-blocks of the block in a 3D configuration. Each sub-block includes multiple NAND strings, where one example NAND string is depicted. For example, SB0, SB1, SB2 and SB3 comprise example NAND strings 400n, 410n, 420n and 430n, respectively. The NAND strings have data word lines, dummy word lines and select gate lines. Each sub-block comprises a set of NAND strings which extend in the x direction and which have a common SGD line or control gate layer. The NAND strings 400n, 410n, 420n and 430n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source-end word line and end at WL95, the drain-end word line, for example.

The NAND strings 400n, 410n, 420n and 430n have channels 400a, 410a, 420a and 430a, respectively. Additionally, NAND string 400n includes SGS transistor 401, dummy memory cell 402, data memory cells 403-414, dummy memory cell 415 and SGD transistor 416. NAND string 410n includes SGS transistor 421, dummy memory cell 422, data memory cells 423-434, dummy memory cell 435 and SGD transistor 436. NAND string 420n includes SGS transistor 441, dummy memory cell 442, data memory cells 443-454, dummy memory cell 455 and SGD transistor 456. NAND string 430n includes SGS transistor 461, dummy memory cell 462, data memory cells 463-474, dummy memory cell 475 and SGD transistor 476.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

FIG. 5A depicts an example configuration of the block BLK0 of FIG. 4 and associated access circuitry 569, where the NAND strings are arranged in divisions for primary columns and redundant columns. Since a block can typically include thousands of NAND strings, it may be convenient to divide the block into divisions. Each division in turn includes many columns. Where a column intersects a group of word lines, a word is stored at each such intersection of a column and a group of word lines. For example, with a 16-bit word, there are 16 NAND strings in a column. The block can be divided into primary columns 500 and redundant columns 501. A primary column is a column which does not replace a defective column but is intended to be used to store data as long as it is not defective. A redundant column (replacement column) replaces a defective primary column. A primary column can be deemed defective if one or more of its NAND strings are defective (e.g. more than a predetermined number of errors), for example, or if one or more bit lines of the column is defective (e.g. broken or with high resistance), or for some other reason. The number of redundant columns is much less than the number of primary columns, e.g., <1% of the number of primary columns.

In this example, there are four divisions of primary columns, Div0P-Div3P, and two divisions of redundant columns, Div0R and Div1R. The number of columns per division is less for the redundant column divisions than for the primary column divisions. As a result, the input/output circuits for the redundant column divisions may have a lower degree of parallelism than the input/output circuits for the primary column divisions.

The parallelism of the primary column divisions is represented by two levels of input/output circuits, including a first level L1 and a second level L2, in this example. For the primary columns, the first level includes a first set of input/output circuits 516, 526, 536 and 546, with one input/output circuit per division, and the second level includes a second set of input/output circuits 514, 515, 524, 525, 534, 535, 544 and 545, with two input/output circuits per division. Input/output circuits are connected to controller 122 by bus 502. This is an example of a pipeline in which two units of data are received by one L1 input/output circuit are transferred to two L2 input/output circuits, one unit per L2 input/output circuit. That is, one half of the data is handled by one L2 input/output circuit and the other half is handled by another L2 input/output circuit. In other examples, the primary column divisions have more than two levels of input/output circuits, or may have only one level of input/output circuits. Each L2 I/O circuit is associated with, and connected to, a set of input/output latches. For example, the L2 input/output circuits 514, 515, 524, 525, 534, 535, 544 and 545 are associated with sets of latches 512, 513, 522, 523, 532, 533, 542 and 543, respectively, which in turn are associated with, and connected to, sets of sense circuits 510, 511, 520, 521, 530, 531, 540 and 541, respectively. The input/output circuits of the redundant column divisions are represented by a first level L1. The first level includes a first set of L1 input/output circuits 554 and 555 associated with sets of latches 552 and 553 respectively, which in turn are associated with, and connected to, sets of sense circuits 550, 551 respectively. It will be understood that FIG. 5A illustrates a detailed example and that the present technology is applicable to a wide range of other examples that do not include the features shown.

FIG. 5B illustrates a simplified example of components and operation of a bad column replacement system in a nonvolatile memory system such as memory system 100. Memory structure 126 includes a large number of columns (e.g. with each column corresponding to multiple NAND strings as described above). Columns include primary columns 570 and redundant columns 572. When host 168 sends a command (via data bus 120) that requires memory access (e.g. host sends a read or write command), memory access requests may be generated accordingly by controller 122. Also, controller 122 may generate memory access requests when it needs to access data in memory structure 126 (e.g. to access some memory management data). A memory access request may specify a logical address range, which is converted into physical addresses of memory structure 126. For example, a host read or write command may include a logical address range that corresponds to a set of primary columns 574. When memory access requests are generated, the column addresses corresponding to the memory access requests may be checked against bad columns in column replacement table 147. For example, where a memory access request includes the column addresses of the set of primary columns 574, column replacement table 147 shows a match because column 576 is a bad column that is recorded in column replacement table 147. Column replacement control circuit 146 then redirects at least access to bad column 576, e.g. to a redundant column 578 that may be indicated in column replacement table 147. Column replacement control circuit 146 may be considered a means for applying a bad column replacement scheme to access the redundant columns in response to receiving data access requests directed to the bad columns according to a bad column replacement scheme While column replacement table 147 may maintain a mapping of each bad column to a corresponding replacement column, in some cases, bad columns are simply listed in a predetermined order (e.g. in ascending order by address) with redundant columns assigned sequentially. Thus, a bad column with the lowest address is replaced by a redundant column with the lowest redundant column address, the bad column with the next lowest address is replaced by a redundant column with the next lowest redundant address, and so on. This may simplify tracking of relationships between bad columns and replacement columns (e.g. by incrementing a pointer when a bad column is found from the last replacement column to the current replacement column).

FIG. 5B shows an example where data access requests directed to bad column 576 are redirected to redundant column 578 (which may be in the same or different block or die) in what may be referred to as a "bad column multiplexing" scheme. Other schemes may also be used.

FIG. 5C shows an example in which data for a bad column is reassigned (remapped) to an adjacent column and all subsequent data is similarly reassigned (e.g. addresses may be incremented by one address) during bad column replacement. When a bad column is replaced, it causes data of subsequent columns to be displaced by one column address. Thus, one or more primary columns in a unit (e.g. block, portion of a block, or plane) that are last in order when bad column replacement is performed may be remapped to redundant columns while data from bad columns is simply displaced to a neighboring column that may be a primary column. FIG. 5C shows six bad columns 580a-f, each of which is remapped to another primary column (e.g. by incrementing column addresses by one so that data is remapped to the next column address). In this way, data is displaced (to the right in the view of FIG. 5C) by one column address for each bad column. This displaces data originally directed to the last six columns of primary columns 570 into the first six columns 582 of redundant columns 572. Such scheme in which bad columns are simply skipped by incrementing column addresses may be referred to as a "column skip" or "bad column skip" scheme. Bad columns are indirectly replaced by redundant columns in this arrangement so that one redundant column is used for every bad column identified with data for a bad column located in another primary column rather than in the corresponding redundant column.

In the examples of FIGS. 5C-D, column replacement table 147 may be implemented by entries for bad columns that are ordered by column address. Such an ordered list of bad columns replaced by redundant columns (either replaced directly as in the example of FIG. 5C or indirectly as in the example of FIG. 5D) may provide simple implementation of column replacement. For example, addresses of memory access requests may be compared with entries in a column replacement table to determine if any currently accessed column should be replaced. Because the table is ordered, the entire table does not need to be searched every time. For example, where the table is ordered in ascending order of column addresses of bad columns and memory access requests are received with sequential address ranges (e.g. corresponding to a host read or write command), the address range of the first memory access request may be used to search the table in order until an entry is found with a column address that is within the address range or is greater. If the column address is within the address range of the first memory access request, then bad column replacement is performed (e.g. as illustrated in FIG. 5C or 5D) when executing the first memory access request. The next entry in the table is then selected as the next bad column address. If the column address is higher than the logical address range of the first memory access request, then the entry points to the next bad column. Subsequent memory access requests may simply refer to the next bad column address without searching through the entire table. Whenever a column address range of a memory access request includes a column address of the next bad column (i.e. a match occurs) column replacement is performed and the subsequent entry in the ordered table becomes the next bad column entry.

FIG. 6A shows an example of an implementation of a column replacement table including an ordered list of column addresses of bad columns arranged in order of column addresses of the bad columns (e.g. in column replacement table 147). The left column (CRD#) is an index of bad columns in ascending order (e.g. starting from 0) showing three entries n−1, n, n+1. The right column (CRD Address) shows the column address of the bad columns in ascending order. It can be seen that column addresses in these entries increase (0x0100, 0x0200, 0x0205) down the table. For example, testing to identify bad columns may be performed and bad column addresses may be recorded in a table in a predetermined order (e.g. ascending order) to simplify access. In some cases, a value obtained from such a table may be incorrect, which may cause significant problems.

FIG. 6B illustrates an example of an incorrect value obtained from an ordered list (e.g. in column replacement table 147). For example, FIG. 6B may be an example of misreading of the nth entry of the list of FIG. 6A. This may occur for various reasons, e.g. due to some failure of one or more component of column redundancy circuits. Instead of obtaining a column address "0x0200" for the nth bad column, this shows column address "0x0300." As a result, no column replacement is performed for at least the identified bad column with address 0x0200, which may cause bad data to be read (e.g. from the identified bad column itself, and in some cases, from additional columns). The impact of such an erroneous column address may also include a pointer becoming stuck at the nth entry so that subsequent bad column replacement is not performed. In this way, a bad value from a column replacement table may have a significant effect and may cause a significant amount of bad data to be read.

FIG. 6C shows another example of an incorrect value obtained from an ordered list (e.g. in column replacement table 147). For example, FIG. 6C may be an example of misreading of the nth entry of the list of FIG. 6A. This may occur for various reasons, e.g. due to some failure of one or more component of column redundancy circuits. Instead of obtaining a column address "0x0200" for the nth bad column, this shows column address "0x0000." As a result, no column replacement is performed for at least the identified bad column with address 0x0200, which may cause bad data to be read (e.g. from the identified bad column itself, and in some cases, from additional columns). The impact of such an erroneous column address may also include a pointer becoming stuck at the nth entry so that subsequent bad column replacement is not performed. In this way, a bad value from a column replacement table may have a significant effect and may cause a significant amount of bad data to be read.

Aspects of the present technology are directed to detecting erroneous values in a column replacement table such as shown in FIGS. 6B and 6C so that their effects may be managed, and their impact may be reduced. For example, in these examples, the erroneous column addresses not in order of the ordered list of the column replacement table (i.e. not in ascending order by column address). Such out-of-order entries may be detected, and some action may be taken accordingly to mitigate problems that may result from erroneous bad column addresses.

FIGS. 7A-B show an example of how an erroneous bad column entry may affect reading of data from a memory. FIG. 7A shows an example of a column skip scheme (e.g. as previously illustrated in FIG. 5C) in which a bad column listed in the ordered list of bad columns is skipped and data for the bad column and one or more subsequent columns is reassigned by incrementing column addresses by one address. Columns with logical column addresses 3 and 8 (shaded) are bad columns in this example (e.g. columns listed in a column replacement table). Data is written in order of logical column address in this example, with the column having logical column address 0 (column 0) storing data A (Data Input=A, e.g. storing data A as a result of a memory access request), column 1 storing data B, column 2 storing data C, and so on. Because column 3 was identified as a bad column, no data is stored in column 3 (indicated as data input "x"). Instead, data input D, which was to be stored in column 3 is written to the next column, i.e. to the column with logical column address=4. Data for subsequent columns is similarly reassigned by incrementing column addresses by one address. Data input E, which was to be stored in column 4 is stored in column 5, data input F, which was to be stored in column 5 is stored in column 6 and so on. Thus, skipping column 3 causes data to be shifted to the right in this example. Data may be further shifted because of the bad column having a logical column address 8. Data input H, which was to be stored in column 8 (due to skip of column 3) is written to the next column, i.e. to the column with logical column address 9 so the that data is further shifted to the right. Each bad column causes a shift of data for the bad column and subsequent columns by one column address. These shifts are cumulative so that in a unit of data with y bad columns, data is shifted by y columns at the end of the unit and this shift may cause data to extend to occupy y redundant columns (e.g. columns 11 and 12 may be redundant columns in FIG. 7A with columns 0-10 being primary columns). Subsequently, when data is read, columns 3 and 8 are indicated in a column replacement table as bad columns that do not contain data (Expected Data="x") and no data is read out from these columns (Data Output="x"). Instead, columns 3 and 8 are skipped when reading (as when writing) so "Expected Data" and "Data Output" entries are the same as "Data Input" entries for the columns used (columns 0-2, 4-7 and 9-12). Thus, bad columns are skipped, and data is correctly written in and read from good columns (e.g. including redundant columns 11 and 12).

In some cases (e.g. as illustrated in FIGS. 6B-C) one or more erroneous entries may be obtained from a column redundancy table (e.g. because of failure of one or more component of a column replacement control circuit and/or column replacement table). This may occur after some time (e.g. a fault that develops due to wear or other factor).

FIG. 7B illustrates an example in which an entry for column 3 of FIG. 7A is not correctly obtained so that column 3 is not treated as a bad column during a read. While columns 3 and 8 were originally correctly identified as bad columns in this example, and were skipped during writing, in this example, column 3 is no longer identified as a bad column when reading, which may cause significant impact. For example, because column 3 is not identified as bad, it is not skipped during a read and the Expected Data from column 3 is data D, which was written in column 4. Column 3 may be read. However, column 3 is a bad column and data D was not written in column 3 so that no useful data is obtained (indicated by Data Output="x"). Failure to skip column 3 also means that Expected Data for subsequent columns 4-7 is not incremented by a column address to match the written data (Data Input). Thus, the data that is read (Data Output) is misaligned by 1 column address with respect to what is expected (Expected Data) and may not be useable.

In some cases, an erroneous bad column address obtained from a column replacement table may cause a pointer to become stuck. For example, where an entry in a column replacement table that indicated logical column address 3 is erroneously read as a higher column address (e.g. as illustrated in FIG. 6B) or a lower column address (e.g. as illustrated in FIG. 6C), a pointer directed to the current bad column address may not match any address of memory access requests and may not advance to the next bad column address (e.g. may not advance to the next column in a column replacement table—containing logical column address 8 in this example). Thus, even where an entry in a column replacement table for column 8 could be correctly obtained, a stuck pointer directed to an erroneous address may cause a column replacement control circuit to fail to apply column replacement to column 8 also. This may cause an attempted read of column 8, which was not written because it was identified as a bad column. Thus, no useful data is obtained from column 8. It also causes a further misalignment of Expected Data with the data that is read (Data Output) so that data is misaligned by 2 column addresses after column 8. While this example refers to a column skip scheme, other bad column replacement schemes may also be affected by erroneous column addresses obtained from column replacement tables.

Figure 8:
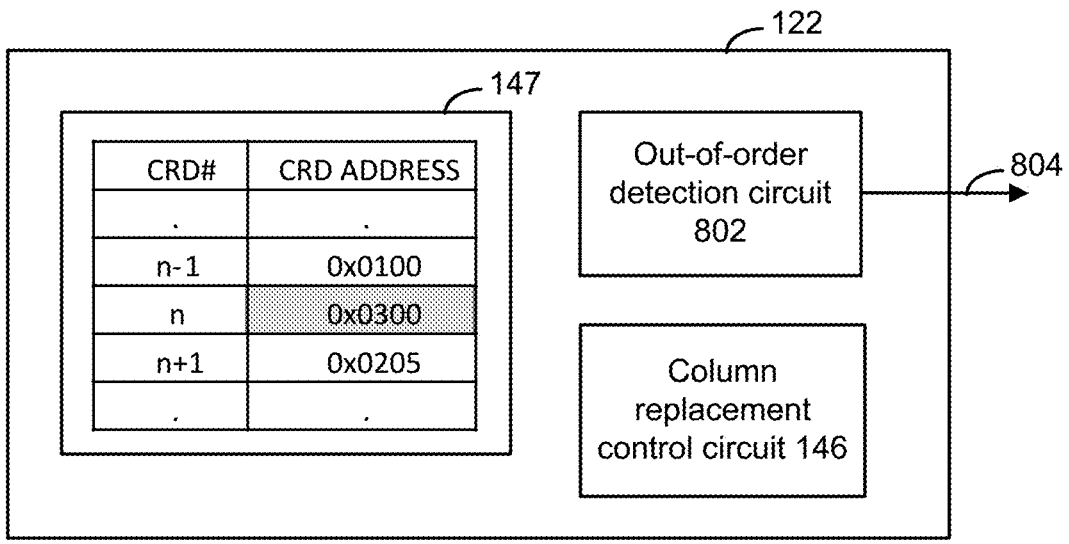
FIG. 8 illustrates an example of a column replacement table and control circuits.

FIG. 8 shows an example of circuits configured to reduce the impact of obtaining an erroneous column address from a column replacement table. FIG. 8 shows certain components of controller 122 including column replacement table 147, which includes an erroneous column address 0x0300 (shaded) as previously described with respect to FIG. 6B. For example, the nth entry may initially record logical column address 0x0200 as a bad column and subsequently the nth entry may be read as 0x300, which may cause column replacement control circuit 146 to fail to replace the bad column having logical column address 0x0200 and may affect additional columns as shown in FIG. 7B.

Out-of-order detection circuit 802 is provided to detect an out-of-order entry in column replacement table 147. For example, out-of-order detection circuit 802 may identify the nth entry (CRD#=n) as an out-of-order entry because it includes a logical column address (0x0300) that is higher than the subsequent entry (n+1 th entry with logical column address 0x0205). Because column replacement table 147 is arranged in ascending order, each entry should include a logical column address that is greater than that of the previous entry. When this order is not observed, an out-of-order entry may be indicated. While not every erroneous column address may result in an out-of-order entry (e.g. if the erroneous nth entry was 0x0190 instead of 0x0300 then the ascending order would be maintained), detecting out-of-order entries may provide a simple, rapid way to detect many erroneous column addresses.

Out-of-order detection circuit 802 may identify an out-of-order entry using any suitable technique and at any time (e.g. during testing, while accessing memory, as a background operation between memory access operations, or otherwise). Out-of-order detection circuit 802 may be configured to inform column replacement control circuit 146 when an out-of-order entry is found so that column replacement control circuit 146 can take appropriate action (e.g. may modify a column replacement scheme appropriately). Action taken by a column replacement control circuit may depend on the column replacement scheme being used (e.g. one of the schemes described above, or other scheme) and the out-of-order entry or entries indicated.

In addition to informing column replacement control circuit 146 of an out-of-order entry in column replacement table 147, out-of-order detection circuit 802 may generate an output signal 804 indicating that an out-of-order condition has occurred (this may be the same signal as sent to column replacement control circuit 146 to inform it of the out-of-control condition). Output signal 804 may be provided at a test interface (e.g. JTAG interface) during testing so that the occurrence of an out-of-order condition is communicated to test equipment and may be used for sorting of a memory system. For example, a memory system with more than a threshold number of occurrences of erroneous entries during testing may be discarded. A memory system with one or more occurrences of an out-of-order condition that are fewer than the threshold number during testing may be sorted for low-reliability use (e.g. with high redundancy). A memory system with no occurrence of an out-of-order condition during testing may be sorted for high-reliability use (if there are no other significant problems). In other examples, instead of, or in addition to sending output signal 804 to test equipment through a test interface, the occurrence of an out-of-order condition may be recorded (in memory structure 126 or elsewhere) so that it can later be read (e.g. by a host through a host interface). The occurrence of out-of-order conditions may be recorded in an error log or other structure during testing and/or during normal use to assist in failure analysis.

Figure 9:
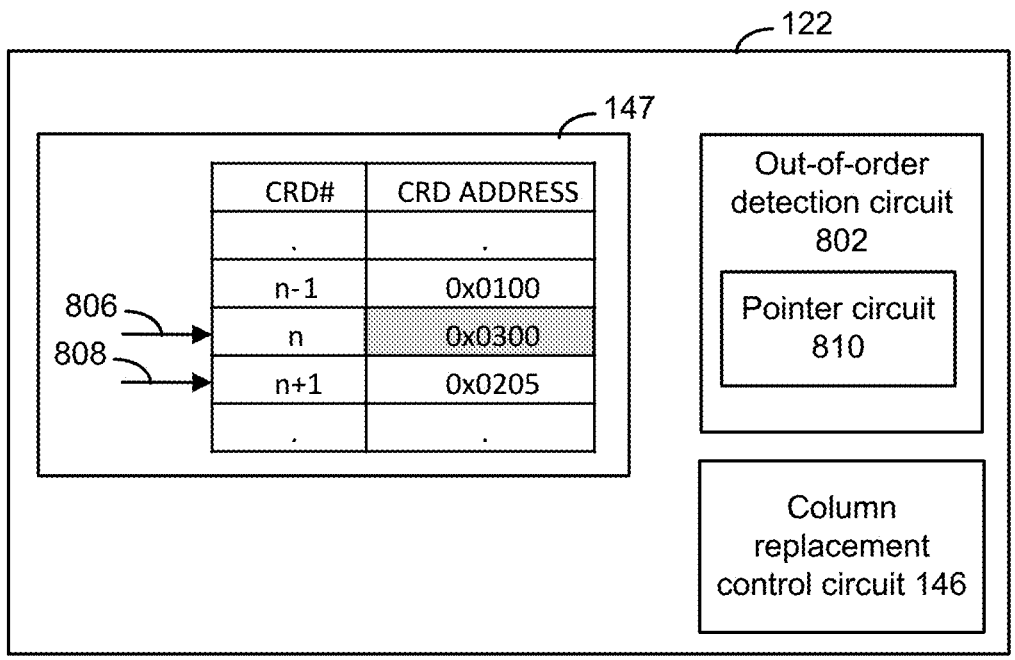
FIG. 9 illustrates an example of a column replacement table with pointers and pointer circuit.

Out-of-order detection circuits may be implemented in various ways. FIG. 9 shows an example implementation that uses two pointers, first pointer 806 and second pointer 808 and a pointer circuit 810 that may control pointers 806, 808 and may provide information regarding pointers 806, 808 and the entries they point to for identification of an out-of-order entry. For example, pointer circuit 810 may detect a stuck pointer, detect a pointer obtaining a match before another pointer that is expected to obtain a match first, directly compare CRD Address entries (logical column addresses) at locations indicated by pointers 806, 808, or otherwise use pointers to identify an out-of-order entry. For example, where the entry for pointer 808 (column address 0x0205) obtains a match prior to the entry for pointer 806 (column address 0x0300) this may indicate that pointer 806 is directed to an out-of-order entry (e.g. where the internal address is incremented sequentially from a starting address an earlier match implies a lower address and thus provides a way of comparing addresses). Pointers may be incremented whenever they match so that a pointer that is incremented in an unexpected order may indicate an out-of-order entry (e.g. incrementing pointer 808 prior to incrementing pointer 806 may indicate an out-of-order entry). Comparing the matching or movement of such pointers may provide an indirect way to compare column addresses of the entries to which the pointers are directed. Comparing column addresses may also be performed directly (e.g. by a comparator). Where first pointer 806 points to the nth entry containing the logical column address "0x0300" and second pointer 808 points to the n+1 th entry containing the logical column address "0x0205" as shown, pointer circuit 810 may compare these addresses directly or indirectly and provide an output indicating that the entries are out-of-order (n+1 th entry should have a higher address than the nth entry because of ascending order of bad column addresses).

Pointers 806, 808 may be integrated with column replacement control circuit 146 so that the same pointers (pointers 806, 808) are used by column replacement control circuit 146 to perform column replacement when writing and reading and are also used to detect out-of-order entries. In this way, out-of-order entry detection may be performed during memory access when column replacement is performed. This may allow a column replacement control circuit to take action in response to detection of an out-of-order entry so that the impact of such an out-of-order entry may be reduced. In this way, erroneous column addresses that were not present earlier (e.g. during testing) that arise after some use may be found during memory access and some action may be taken to reduce the impact of such erroneous column addresses. For example, pointer 806 may be forced to advance from the nth entry (e.g. to an n+2th entry), without any match occurring, so that it does not remain stuck at the nth entry. Other actions may also be taken, e.g. as described in certain examples below.

Figure 10:
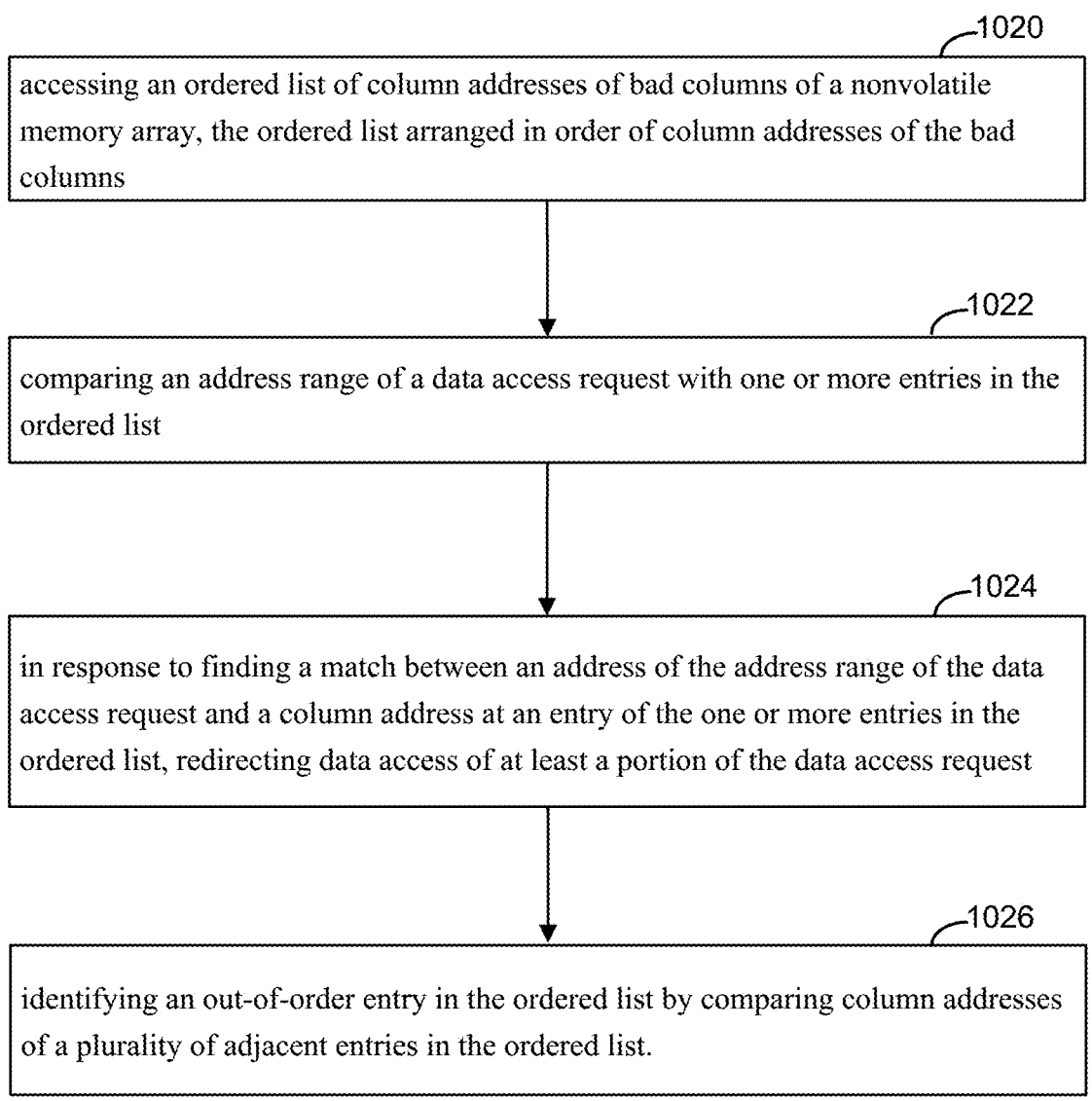
FIG. 10 shows an example of a method that includes identifying an out-of-order entry in an ordered list.

FIG. 10 shows an example method that may use components of any of the systems described above (e.g. in FIGS. 8-9). The method includes accessing an ordered list of column addresses of bad columns of a nonvolatile memory array, the ordered list arranged in order of column addresses of the bad columns 1020 (e.g. column replacement table 147 in any of the examples above), comparing an address range of a data access request with one or more entries in the ordered list 1022, and in response to finding a match between an address of the address range of the data access request and a column address at an entry of the one or more entries in the ordered list, redirecting data access of at least a portion of the data access request 1024 (e.g. as shown in FIG. 5B or 5C. The method further includes identifying an out-of-order entry in the ordered list by comparing column addresses of a plurality of adjacent entries in the ordered list 1026 (e.g. pointer circuit 810 comparing nth and n+1 th column addresses of column replacement table 147 in FIG. 9, or comparing at which pointer a match occurs first).

Various actions may be taken in response to detection of an out-of-order entry in a column replacement table. FIG. 11 shows an example based on the scenario previously shown in FIG. 7B, where the entry for a bad column with logical column address 3 ("column 3") is erroneously received so that column 3 is not recognized as a bad column when reading. In the column skip scheme described with respect to FIGS. 7A-B, column 3 was skipped during writing (because it was recognized as bad) so that reading it does not provide any good data (shown as "x"). Furthermore, failure to skip column 3 during a read operation results in a misalignment of read data (Data Output) and Expected data. Thus, bad data is obtained from column 3 and misaligned data is obtained from columns 4-7 (misaligned by 1 column address).

Using two pointers with a column replacement table may allow two different entries in the column replacement table to be compared with the logical address range of a memory access request. This may allow replacement of two bad columns within the logical address range of a memory access request. The same pointers (e.g. pointers 806, 808) may also be used for detecting an out-of-order entry. For example, a first pointer may be directed to the entry originally for column 3 (current bad column entry) and a second pointer may be directed to the entry for column 8 (which is the next bad column in a column replacement table). Comparing the entries at these pointers (or comparing when pointers obtain a match or are incremented) may indicate an out-of-order entry (e.g. logical address "3" may be read as some other address such as "15" which is greater than 8 and is thus out-of-order). While this indicates a bad column at some address prior to column 8, the location of the bad column may be unknown, and misalignment may continue until column 8. Because a misalignment of 1 address is known to have occurred, instead of skipping just the bad column with logical address 8, two columns may be skipped (e.g. column 8 and column 9 as shown) and reading of data I may proceed from column 10. Skipping an extra column at this point makes up for the failure to skip a bad column earlier (bad column 3) so that reading is realigned for columns 10 and higher. In other examples, detection of an out-of-order entry may allow identification of misaligned read data (e.g. from columns 4-7) so that some recovery of data may be performed. The pointer directed to an entry identified as an out-of-order entry may be forced to move even without obtaining a match so that it does not remain stuck. Thus, for example, where the pointer directed to the entry that was originally for column 3 indicates a logical column address 15, instead of waiting for a match (i.e. for a memory access request including logical column address 15), the pointer may advance to the next entry in the table after column 8. In this way, the column replacement scheme continues to operate for subsequent column addresses and only a limited number of columns (e.g. columns with logical addresses 3-9 in this example) are affected. If this number is sufficiently small, correction may be performed by ECC or otherwise.

Aspects of the present technology are applicable to a range of column replacement schemes other than a column skip scheme as shown in FIG. 11. Such schemes may include bad column multiplexing schemes (e.g. as described with respect to FIG. 5B) and other schemes.

FIG. 12A illustrates an example of a bad column multiplexing scheme in which data from a bad column is stored in a redundant column. A column replacement table maintains a record of the reassigning of such bad columns to redundant columns. For example, bad columns may be mapped to replacement columns in ascending order of column address to provide a simple mapping that requires little overhead.

FIG. 12A shows the bad columns with logical addresses 3 and 8 remapped to corresponding redundant columns 1228 so that any memory access directed to one of these addresses should result in a match with a corresponding entry in a column replacement table and redirection of the memory access to the data stored in a replacement column. Memory access may start at a start address so that a column 3 obtains a match first and is replaced with the replacement column that stores data D. A pointer may point to the current bad column and may be incremented when a match occurs. The next bad column, column 8, is similarly replaced by storing data I in a redundant column of redundant columns 1228. This may be repeated for any number of bad columns.

FIG. 12B illustrates what may happen when an erroneous address is obtained from a column redundancy table. In this case, column address 3 is not found in the column redundancy table so that replacement of this column is not performed, no good data is obtained from column 3 (indicated by Data Output "x") and data D in replacement columns 1228 is not accessed. A pointer may become stuck at this point because the column address read (e.g. corrupted address) does not match and so the pointer is not incremented to column 8. While the column replacement table may correctly record column 8, because the pointer is stuck, replacement of column 8 may not be performed so that data I stored in replacement columns 1228 is not accessed. Instead, an attempt may be made to access column 8, which is bad and was not written so that no useful data is obtained. Any subsequent bad columns are similarly accessed instead of accessing corresponding replacement columns so that the amount of bad data from a single bad column address in a column replacement table may be significant.

Figure 12C:
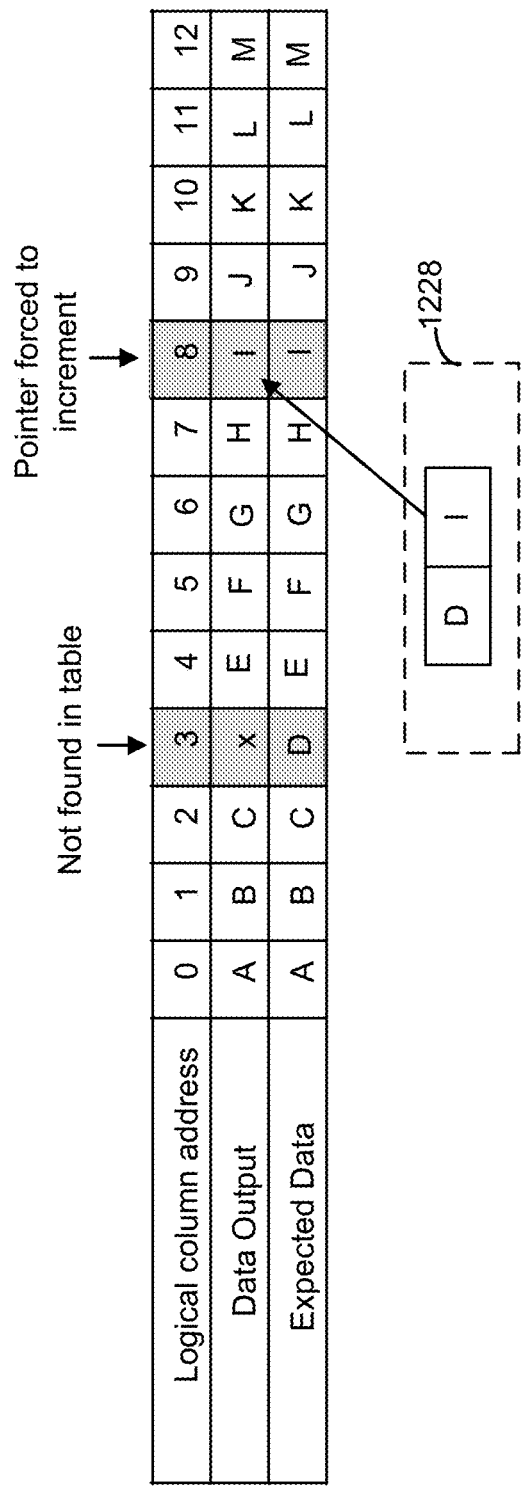

FIG. 12C shows an example of how aspects of the present technology may be applied to the multiplexing column replacement scheme of FIGS. 12A-B. In this example, two pointers (e.g. pointers 806, 808) are directed to neighboring bad columns in a column replacement table. For example, the first address of a memory access request may be used to look for the lowest entry in a column replacement table that is the same or higher than the first address of the memory access request. The first pointer may be directed to this entry and the second pointer may be directed to the next entry in the column replacement table. Whenever a match occurs with an entry at a pointer, replacement is performed, and the pointer is moved. FIG. 12C shows a situation where a first pointer (current pointer) points to the entry that originally indicated logical column 3 (data D for column 3 was instead stored in replacement columns 1228 as shown in FIG. 12A). An erroneous reading of the table means that logical column address 3 is not found at this entry, no match occurs, and bad column 3 is not replaced. The entry at this location is detected as an out-of-order entry. For example, a second pointer for the next bad column is directed to column 8, which may be a lower column address than the erroneous column address from the entry at the current pointer (e.g. column address 3 may be misread as column address 12, which is higher than 8). This may cause a match to occur at the second pointer (and cause the second pointer to increment) before any match occurs at the first pointer thus indicating that the entry at the first pointer is an out-of-order entry. When the match occurs, data I for column 8 is obtained from a replacement column as shown. Because an out-of-order condition is indicated, the first pointer may be forced to increment even though no match has occurred at the column address specified at the entry where the first pointer is directed. Using two pointers in this provides a way to compare entries on the fly based on the order in which each pointer obtains a match and thus provides a rapid way to compare entries during memory access. This may allow rapid detection of an out-of-order entry during use so that a pointer directed to such an out-of-order entry can be forced to advance and does not remain stuck. While this example shows data D for bad column 3 being stored in one of replacement columns 1228, in some cases, a bad entry may occur prior to writing data so that a replacement column contains the wrong data. In either case, the data corresponding to the bad column (data D in this example) may not be easily recoverable.

Aspects of the present technology may be implemented using any suitable components (e.g. suitable circuits of a controller that are adapted to detect an out-of-order entry in a column replacement table and to take action to mitigate the consequences of such an entry).

Figure 13:
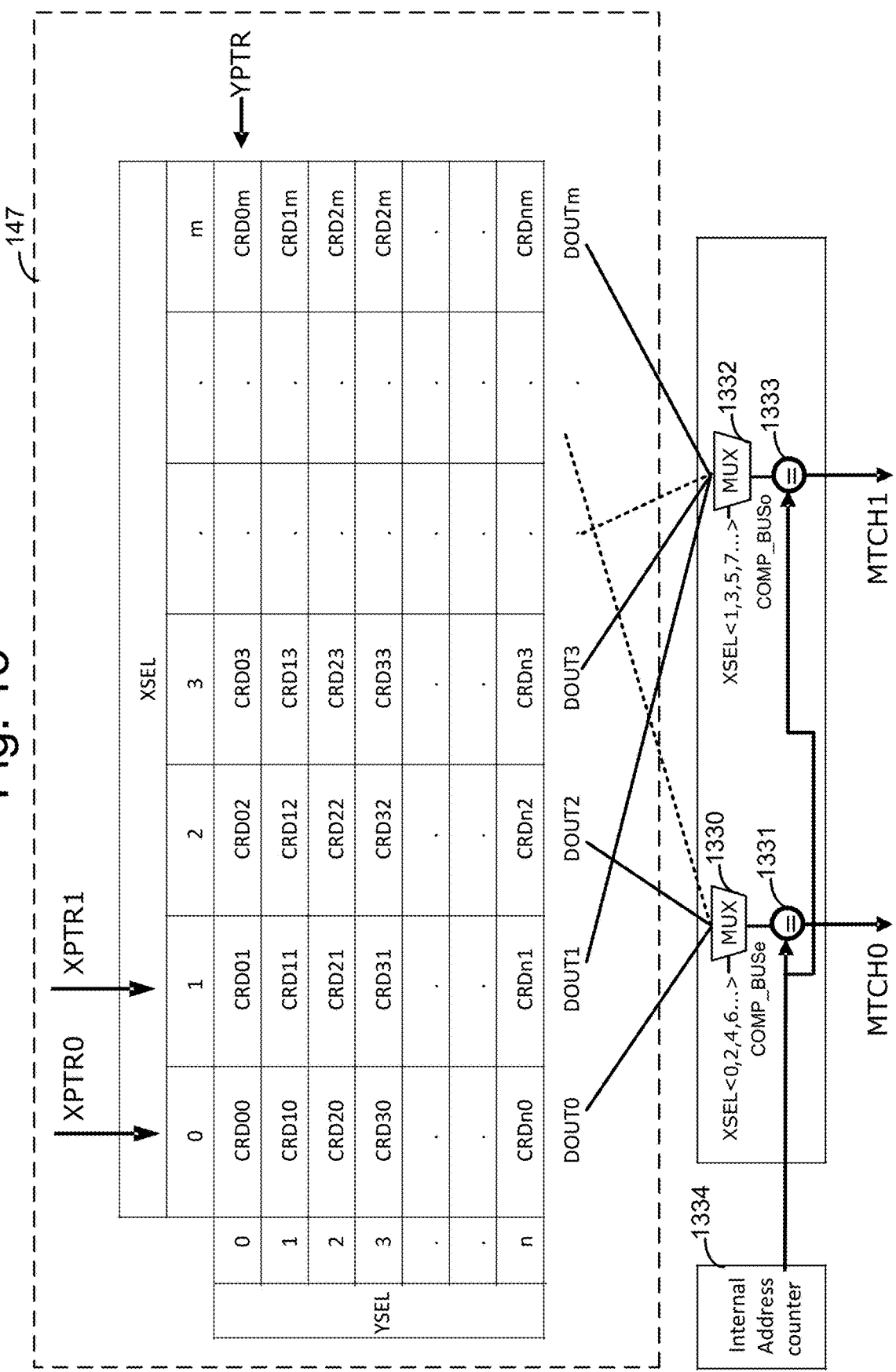
FIG. 13 illustrates an example of a two-dimensional column replacement table with pointers.

FIG. 13 shows an example of an implementation of column replacement table 147 with some additional components including access components. In this example, column replacement table 147 is a two-dimensional table (instead of the one-dimensional table previously shown), with bad columns listed in ascending order in the entries (e.g. CRD0 has a lower address than CRD1, which has a lower address than CRD2 and so on). A y-pointer (YPTR) selects a row from 0 to n (row 0 in this example) in column replacement table 147 and two different column entries between 0 and m are selected by two x-pointers XPTR0 and XPTR1 (directed to column 0 and column 1 of column replacement table 147 in this example). A column pointer, XSEL may include two sequential ON bits in an m-bit word to indicate the locations of the two x-pointers, e.g. an even bit specifying an even column in column replacement table 147 (XSEL<0, 2, 4, 6 . . . >) and an odd bit specifying an adjacent odd column in column replacement table 147 (XSEL<1, 3, 5, 7 . . . >). An even column multiplexer, MUX 1330 is coupled to select an entry (logical column address) indicated by XSEL<0, 2, 4, 6 . . . > from even columns (0, 2, 4, 6 . . . ) of column replacement table 147 and send the entry (COMP_BUSe) to an even comparator 1331 to compare the entry with an internal address (e.g. an address received in a memory access request). An odd column multiplexer, MUX 1332 is coupled to select an entry (logical column address) indicated by XSEL<1, 3, 5, 7 . . . > from odd columns (1, 3, 5, 7 . . . ) of column replacement table 147 and to send the entry (COMP_BUSo) to an odd comparator 1333 to compare the entry with the internal address. While two x-pointers are shown in this example, in some examples, three or more x-pointers may be used. In some cases, more than one y-pointer may be used.

When even comparator 1331 obtains a match (logical column address equals the internal address), its output, MTCH0 goes high. Similarly, when odd comparator 1333 obtains a match, its output, MTCH1 goes high. The internal address is incremented sequentially from a starting address of a memory access request by internal address counter 1334 with bad column replacement occurring whenever a match occurs (e.g. logical column address may be sent to column replacement control circuit 146). When a match occurs, the pointer is incremented (e.g. if even comparator 1331 obtains a match with an entry from column 0, a respective pointer is incremented to the next even column, column 2). Thus, pointers are expected to obtain a match and increment alternately, e.g. odd-even-odd-even or MTCH1-MTCH0-MTCH1-MTCH0. Deviation from this order may indicate an out-of-order entry (e.g. if, after the even pointer is incremented to column 2, MTCH0 goes high indicating a match before MTCH1 goes high, this may indicate that the odd pointer is stuck on an out-of-order pointer).

Figure 14:
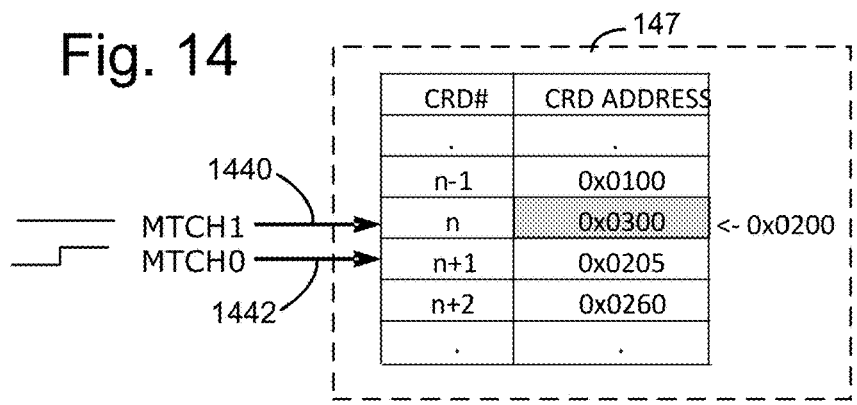
FIG. 14 illustrates an example of a one-dimensional column replacement table with pointers including an out-of-order entry.

FIG. 14 illustrates an example of two pointers, an odd pointer 1440 (e.g. corresponding to XPTR1) and an even pointer 1442 (e.g. corresponding to XPTR0) directed to entries n and n+1 respectively of a one-dimensional example of column replacement table 147. The logical column address (CRD address) stored in entry n is erroneously obtained as 0x300 instead of its correct logical column address 0x0200 so that MTCH1 does not go high. Instead, MTCH0 goes high when a hit occurs at entry n+1 (logical column address 0x0205 matches the internal address). This may be taken as an indication that entry n is out-of-order. In response, pointer 1440 may be forced to increment A suitable circuit may be coupled to outputs MTCH0 and MTCH1 to identify out-of-order entries from the order in which these outputs go high (e.g. to detect the condition illustrated in FIG. 14.

Figure 15A:
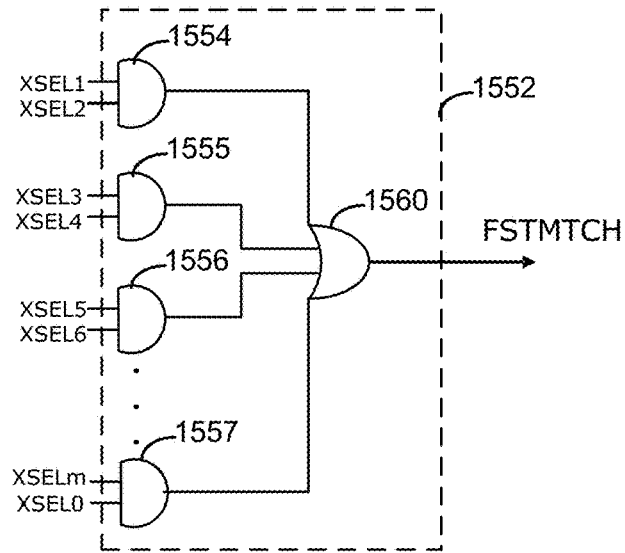
FIGS. 15A-B illustrate control circuits to detect an out-of-order entry and force a pointer move.

FIG. 15A shows an example of a match predictor circuit 1552 that may be used with MTCH0 and MTCH1 (e.g. as shown in FIG. 13) to generate an output, FSTMTCH, that indicates which of outputs MTCH0 and MTCH1 is expected to match (go high) first at any given time. For example, match predictor circuit 1552 may receive all bits (bits 0 to m) of XSEL and determine which of pointers 1440, 1442 is the first one that should match. AND gates 1554-1557 perform AND operations on respective pairs of neighboring bits of XSEL that have a higher even bit (e.g. XSEL1 and XSEL2) and generate a high output to OR gate 1560 if both bits are selected (e.g. both high). If an output of any AND gate 1554-1557 is high (true) then OR gate 1560 is high. For example, if XSEL3 and XSEL4 are high, the output of AND gate 1555 and OR gate 1560 are high so that FSTMTCH is high. When FSTMTCH is high, it indicates that MTCH1 (odd column match) should go high first. When FSTMTCH is low (e.g. XSEL0 and XSEL1 are high as shown in FIG. 13) this indicates that MTCH0 (even column match) should go high first. The number of AND gates used may be half the number of columns, m, in column replacement table 147, with the last AND gate receiving XSELm and XSEL0.

Figure 15B:
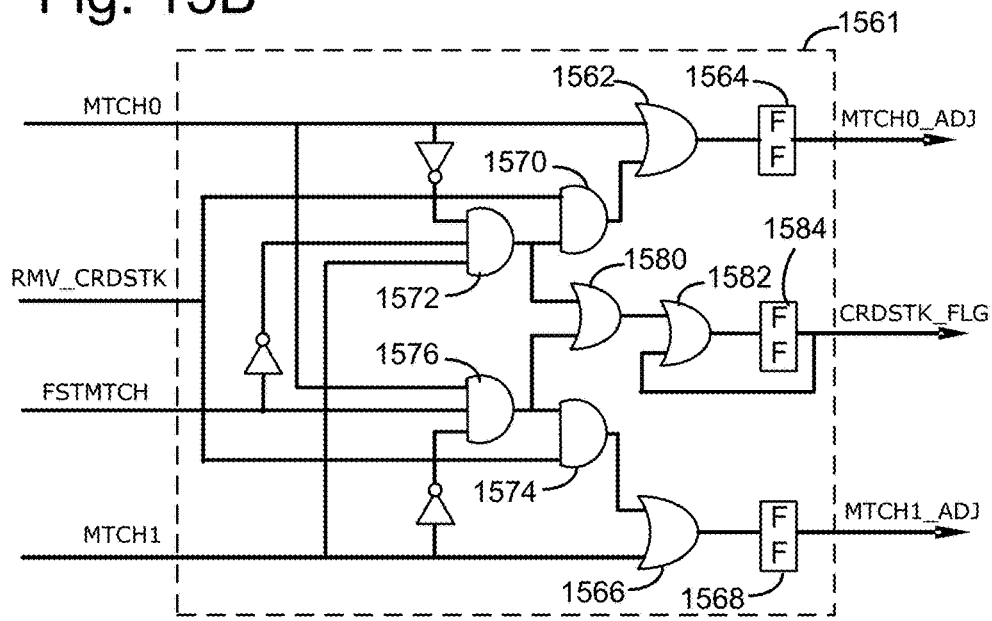

FIG. 15B shows an example of out-of-order detection circuit 1561 that receives MTCH0, MTCH1 (e.g. from comparators 1331, 1333) and FSTMTCH (e.g. from match predictor circuit 1552) and uses them to generate appropriate outputs to indicate an out-of-order entry in a column replacement table so that appropriate measures may be taken. Out-of-order detection circuit 1561 in combination with match predictor circuit 1552 may be considered an example implementation of out-of-order detection circuit 802. Outputs include adjusted match output MTCH0_ADJ, which is an adjusted even match output based on MTCH0. Outputs also include adjusted match output MTCH1_ADJ, which is an adjusted even match output based on MTCH1. These match outputs may be adjusted by forcing them to go high as appropriate (e.g. when an out-of-order entry in a column replacement table is detected) even in cases where no match has occurred (e.g. where the column address of an entry at a pointer does not match an internal address) so that pointers do not become stuck and column replacement continues after an out-of-order entry occurs.

When MTCH0 goes high, the output of OR gate 1562 provided to flip-flop 1564 goes high and MTCH0_ADJ goes high. Similarly, when MTCH1 goes high, the output of OR gate 1566 provided to flip-flop 1568 goes high and MTCH1_ADJ goes high. Thus, when no out-of-order entry occurs, MTCH0_ADJ and MTCH1_ADJ simply track MTCH0 and MTCH1.

An additional input to OR gate 1562 comes from AND gate 1570 so that when the output of AND gate 1570 goes high, it causes MTCH0_ADJ to go high. AND gate 1570 performs an AND operation on RMV_CRDSTK and the output of AND gate 1572 so that RMV_CRDSTK acts as an enable/disable input for adjustment (if RMV_CRDSTK is low then MTCH0_ADJ is simply MTCH0). AND gate 1572 performs an AND operation on inverted MTCH0 (~MTCH0), inverted FSTMTCH (~FSTMTCH) and MTCH1. Thus, the output of AND gate 1572 goes high when MTCH0 is low, FSTMTCH is low (signifying MTCH0 is expected to go high next) and MTCH1 is high, a condition that occurs when MTCH1 goes high first even though MTCH0 is expected to go high first. This indicates an out-of-order condition and causes MTCH0_ADJ to go high even though MTCH0 is low and thus forces a corresponding pointer (e.g. XPTR0) to advance (i.e. forced to move).

When MTCH1 goes high, the output of OR gate 1566 provided to flip-flop 1568 goes high and MTCH1_ADJ goes high. Thus, when no out-of-order entry occurs, MTCH1_ADJ simply tracks MTCH1. An additional input to OR gate 1566 comes from AND gate 1574 so that when the output of AND gate 1574 goes high, it causes MTCH1_ADJ to go high. AND gate 1574 performs an AND operation on RMV_CRDSTK and the output of AND gate 1576 so that RMV_CRDSTK acts as an enable/disable input for adjustment (if RMV_CRDSTK is low then MTCH1_ADJ is simply MTCH1). AND gate 1576 performs an AND operation on MTCH0, FSTMTCH and inverted MTCH1 (~MTCH1). Thus, the output of AND gate 1576 goes high when MTCH0 is high, FSTMTCH is high (signifying MTCH1 is expected to go high next) and MTCH1 is low, a condition that occurs when MTCH0 goes high first even though MTCH1 is expected to go high first. This indicates an out-of-order condition and causes MTCH1_ADJ to go high even though MTCH1 has not gone high and thus forces a corresponding pointer (e.g. XPTR1) to move (i.e. forced to move) to a subsequent entry so that it does not become stuck at an out-of-order entry in the column replacement table. Out-of-order detection circuit 1561 may detect when an out-of-order entry occurs in column replacement table 147 and may be considered means for identifying an out-of-order entry in the ordered list of bad columns.

In addition to providing adjusted match output signals MTCH0_ADJ and MTCH1_ADJ, out-of-order detection circuit 1561 generates an output signal, CRDSTK_FLG to indicate when a column redundancy pointer is stuck (e.g. as output signal 804). If the output of either AND gate 1572 or AND gate 1576 goes high, indicating a match has occurred out of the expected order, OR gate 1580 receives a high input, which is passed to OR gate 1582 and flip-flop 1584 and generates a high output signal CRDSTK_FLG. Output signal CRDSTK_FLG may be provided to test equipment through a test interface (e.g. JTAG interface) and/or may be provided to one or more circuits in a memory system. For example, CRDSTK_FLG may be provided to a column replacement control circuit such as column replacement control circuit 146 so that a column replacement scheme may be modified appropriately to reduce the impact of an out-of-order entry. CRDSTK_FLG may trigger writing of one or more entries in an error log that may be used for testing and/or failure analysis (e.g. error log written in memory structure 126). In some cases, occurrence of one or more out-of-order entries in a column replacement table during testing may be used to sort memory devices which may include discarding certain memory devices. For example, a memory device with more than a threshold number of out-of-order entries may be discarded while a memory device with a significant number that is fewer than the threshold number may be used for low-reliability applications while a memory device with no out-of-order entries may be used for high-reliability applications. The components generating CRDSTK_FLG, including OR gates 1580, 1582 and flip-flop 1584 may be considered means for generating an output signal in response to detection of the out-of-order entry in the ordered list of bad columns.

Figure 16A:
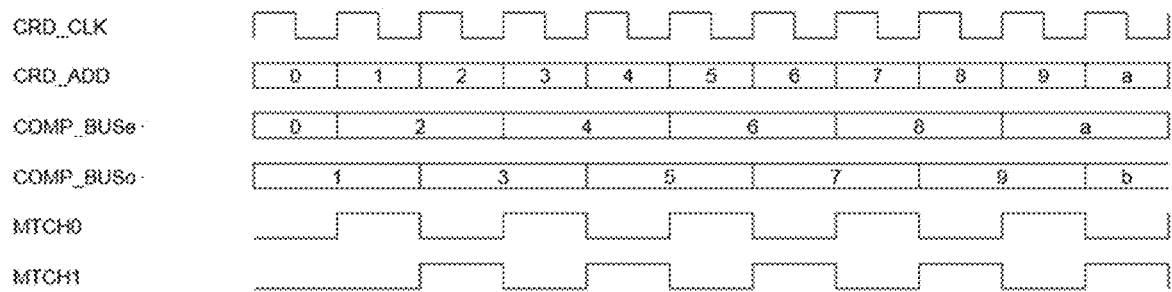
FIGS. 16A-C show timing diagrams that illustrate forced movement of a pointer.
Figure 16B:
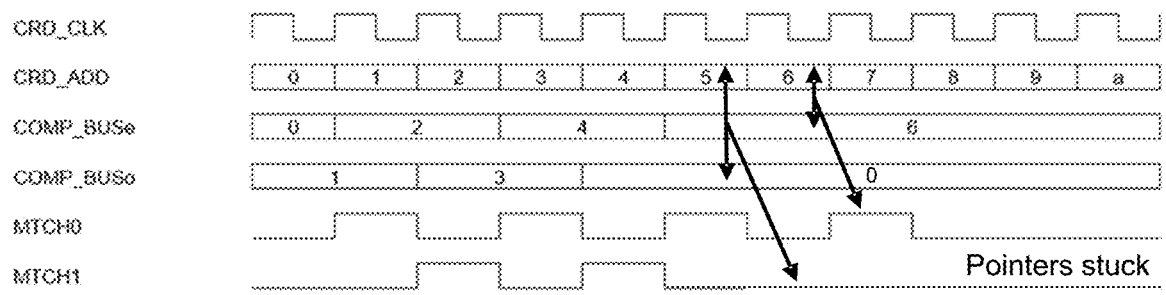
Figure 16C:
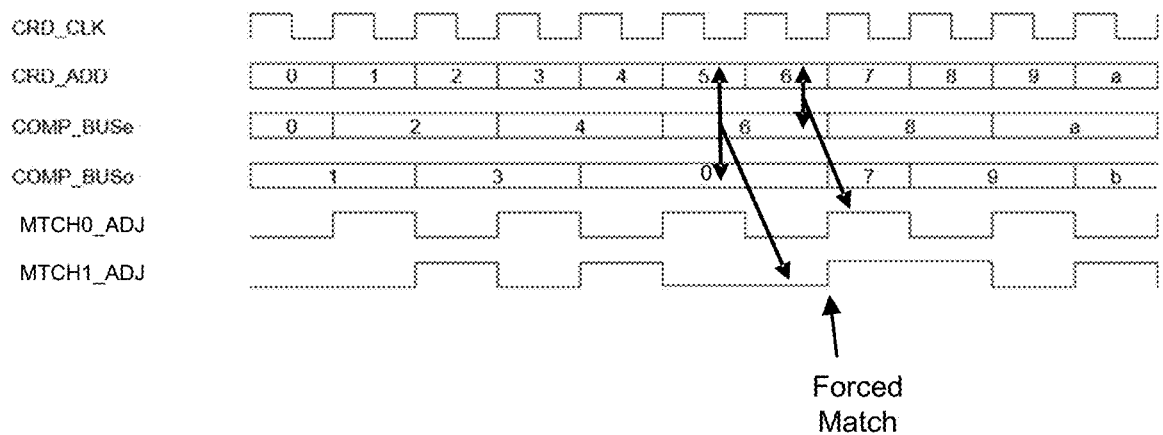

FIGS. 16A-C illustrate how forcing a match (e.g. using out-of-order detection circuit 1561 to generate adjusted match signals MTCH0_ADJ and MTCH1_ADJ) may avoid a stuck pointer resulting from an out-of-order entry in a column replacement table (e.g. as shown in FIGS. 6B-C).

FIG. 16A illustrates a timing diagram for an example of match signals MTCH0 and MTCH1 in which no out-of-order entries are encountered so that a pointer does not become stuck. The top line, CRD_CLK shows a clock signal used by a column replacement circuit. The second line shows the column replacement address (CRD_ADD) indicates the internal address of the column replacement circuit as it is incremented during memory access. The third and fourth lines show outputs provided to comparators from even columns (COMP_BUSe) and odd columns (COMP_BUSo) respectively of a column redundancy table (e.g. outputs provided from MUX 1330 to comparator 1331 and from MUX 1332 to comparator 1333 respectively). The fifth and sixth lines show MTCH0 and MTCH1 respectively. It will be understood that that this timing diagram is for illustration purposes and that in normal operation MTCH0 and MTCH1 may not go high as frequently as shown (e.g. this timing diagram may correspond to test conditions that create a match at every internal address).

FIG. 16B illustrates an example of how a pointer may become stuck. For example, at CRD_ADD=5, MTCH1 becomes stuck (e.g. because of an out-of-order entry "0" that does not match an internal address provided). This results in MTCH1 remaining low. Subsequently, at CRD_ADD=6, MTCH0 goes high and then becomes stuck also.

FIG. 16C shows an example where MTCH0_ADJ and MTCH1_ADJ (e.g. as provided by out-of-order detection circuit 1561) may allow a pointer stuck condition to be overcome under the same conditions as in FIG. 16B. When out-of-order entry "0" is encountered, instead of remaining stuck, MTCH1_ADJ is forced high so that a forced match occurs and the corresponding pointer (e.g. XPTR1) moves to a subsequent entry in column replacement table 147.

Figure 17:
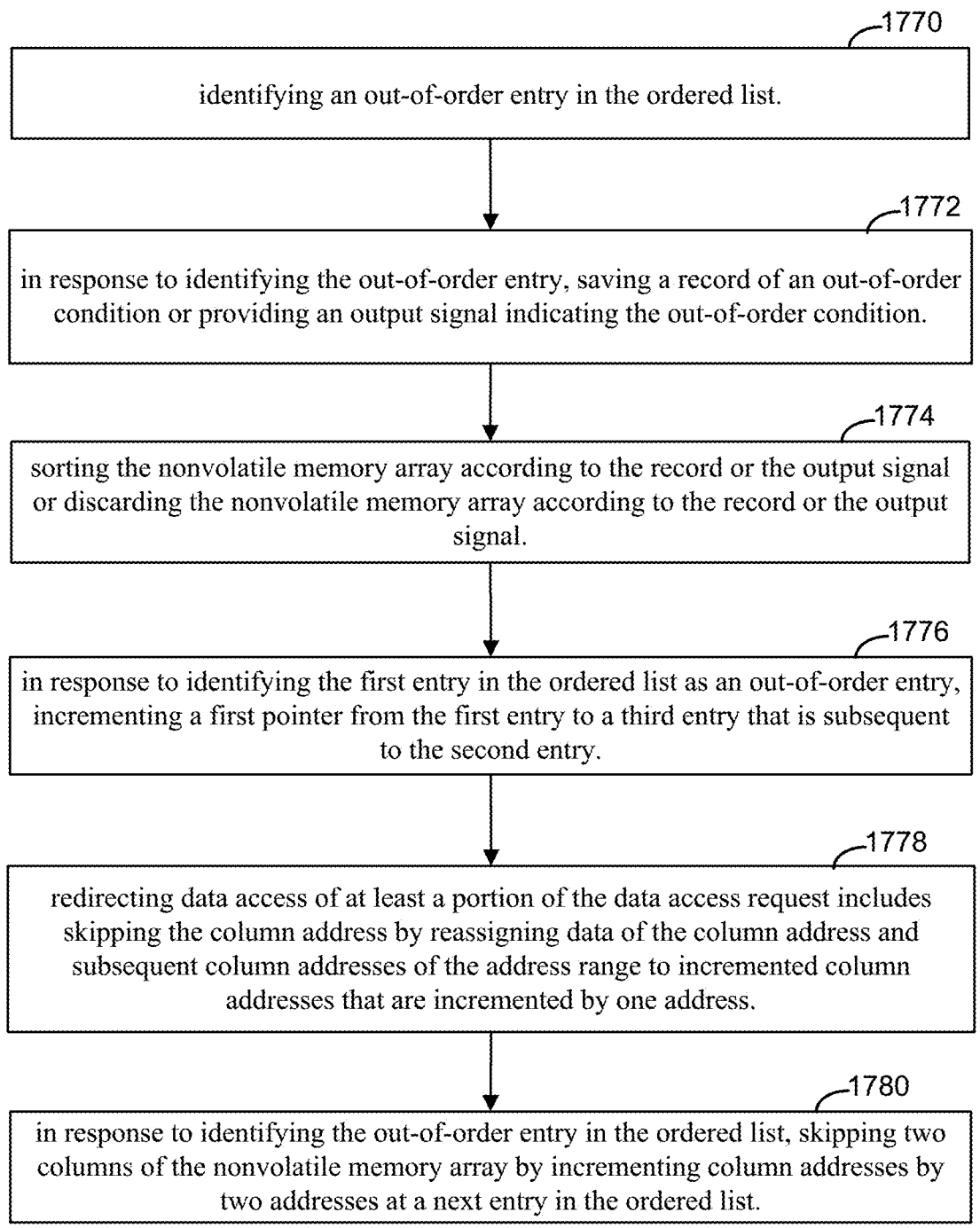
FIG. 17 shows an example of a method that includes actions taken in response to identifying an out-of-order entry.

FIG. 17 illustrates a method that includes certain steps that may be taken in response to identifying an out-of-order entry in a column replacement table that is maintained as an ordered list that is ordered according to column address. The method includes identifying an out-of-order entry in the ordered list 1770 and in response to identifying the out-of-order entry, saving a record of an out-of-order condition or providing an output signal indicating the out-of-order condition 1772. The method further includes sorting the nonvolatile memory array according to the record or the output signal or discarding the nonvolatile memory array according to the record or the output signal 1774. These steps may be carried out during testing of a memory system at a factory. The method further includes, in response to identifying the first entry in the ordered list as an out-of-order entry, incrementing a first pointer from the first entry to a third entry that is subsequent to the second entry 1776 (e.g. as described with respect to FIG. 9 using one or more circuits of FIGS. 13-15 to avoid a stuck pointer). Redirecting data access of at least a portion of the data access request includes skipping the column address by reassigning data of the column address and subsequent column addresses of the address range to incremented column addresses that are incremented by one address 1778 (e.g. as illustrated in FIGS. 5C and 7A) and in response to identifying the out-of-order entry in the ordered list, skipping two columns of the nonvolatile memory array by incrementing column addresses by two addresses at a next entry in the ordered list 1780 (e.g. as illustrated in FIG. 11). While FIG. 17 shows multiple steps occurring in sequence, one or more of these steps may be omitted and/or the order may be changed so that a given implementation may use any combination of one or more such steps as appropriate in any order and not all steps are required.

An example of an apparatus includes a plurality of nonvolatile memory cells arranged in columns including a plurality of redundant columns; and one or more control circuits coupled to the plurality of nonvolatile memory cells, the one or more control circuits configured to maintain an ordered list of bad columns replaced by redundant columns and to detect an out-of-order entry in the ordered list of bad columns replaced by redundant columns.

The one or more control circuits may be configured to detect the out-of-order entry by comparing a first bad column entry in the ordered list of bad columns with a second bad column entry in the ordered list of bad columns. The first bad column entry may be prior to the second bad column entry in the ordered list of bad columns and the one or more control circuits may be further configured to determine the first bad column entry is an out-of-order entry in response to the first bad column entry having a higher address than the second bad column entry in the ordered list of bad columns. The one or more control circuits may be further configured to apply a bad column skip scheme whereby a bad column listed in the ordered list of bad columns is skipped and data for the bad column and one or more subsequent columns is reassigned by incrementing column addresses by one address. The one or more control circuits may be further configured to, in response to detection of the out-of-order entry, reassign data by incrementing column addresses by two addresses at a next bad column address after the out-of-order entry. The one or more control circuits may be further configured to apply a bad column multiplexing scheme whereby data for a bad column is reassigned to a redundant column without reassignment of data for subsequent columns. The one or more control circuits may be further configured to, in response to detection of the out-of-order entry, force a pointer directed to the out-of-order entry to advance to a higher entry in the ordered list of bad columns. The one or more control circuits may be further configured to, in response to detection of the out-of-order entry, generate an output signal indicating that an out-of-order condition has occurred. The one or more control circuits may be further configured to, in response to detection of the out-of-order entry, save a record of occurrence of an out-of-order condition. The plurality of nonvolatile memory cells may be monolithically formed in one or more physical levels of arrays of memory cells having an active area disposed above a silicon substrate with the columns extending vertically through the one or more physical levels.

An example of a method includes accessing an ordered list of column addresses of bad columns of a nonvolatile memory array, the ordered list arranged in order of column addresses of the bad columns; comparing an address range of a data access request with one or more entries in the ordered list; in response to finding a match between an address of the address range of the data access request and a column address at an entry of the one or more entries in the ordered list, redirecting data access of at least a portion of the data access request; and identifying an out-of-order entry in the ordered list by comparing column addresses of a plurality of adjacent entries in the ordered list.

Identifying the out-of-order entry in the ordered list may include comparing a first entry in the ordered list with a subsequent second entry in the ordered list and identifying the first entry in the ordered list as an out-of-order entry if it indicates a column address that is subsequent in order to a column address indicated by the second entry. The method may also include, in response to identifying the first entry in the ordered list as an out-of-order entry, incrementing a first pointer from the first entry to a third entry that is subsequent to the second entry. Redirecting data access of at least a portion of the data access request may include skipping the column address by reassigning data of the column address and subsequent column addresses of the address range to incremented column addresses that are incremented by one address. The method may include, in response to identifying the out-of-order entry in the ordered list, skipping two columns of the nonvolatile memory array by incrementing column addresses by two addresses at a next entry in the ordered list. Redirecting data access of at least a portion of the data access request may include reassigning data for the column without reassignment of subsequent data of the data access request. Identifying may occur during testing of the nonvolatile memory array, the method may further include, in response to identifying the out-of-order entry, saving a record of an out-of-order condition or providing an output signal indicating the out-of-order condition. The method may further include at least one of sorting the nonvolatile memory array according to the record or the output signal or discarding the nonvolatile memory array according to the record or the output signal.

An example of a system means for maintaining an ordered list of bad columns of a nonvolatile memory structure that are replaced by redundant columns of the nonvolatile memory structure; means for applying a bad column replacement scheme to the redundant columns in response to receiving data access requests directed to the bad columns; and means for identifying an out-of-order entry in the ordered list of bad columns.

The system may include means for generating an output signal in response to detection of the out-of-order entry in the ordered list of bad columns.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a plurality of nonvolatile memory cells arranged in columns including a plurality of redundant columns; and
   one or more control circuits coupled to the plurality of nonvolatile memory cells, the one or more control circuits configured to maintain an ordered list of bad columns replaced by redundant columns and to detect an out-of-order entry in the ordered list of bad columns replaced by redundant columns.

2. The apparatus of claim 1, wherein the one or more control circuits are configured to detect the out-of-order entry by comparing a first bad column entry in the ordered list of bad columns with a second bad column entry in the ordered list of bad columns.

3. The apparatus of claim 2, wherein the first bad column entry is prior to the second bad column entry in the ordered list of bad columns and the one or more control circuits are further configured to determine the first bad column entry is an out-of-order entry in response to the first bad column entry having a higher address than the second bad column entry in the ordered list of bad columns.

4. The apparatus of claim 1, wherein the one or more control circuits are further configured to apply a bad column skip scheme whereby a bad column listed in the ordered list of bad columns is skipped and data for the bad column and one or more subsequent columns is reassigned by incrementing column addresses by one address.

5. The apparatus of claim 4, wherein the one or more control circuits are further configured to, in response to detection of the out-of-order entry, reassign data by incrementing column addresses by two addresses at a next bad column address after the out-of-order entry.

6. The apparatus of claim 1, wherein the one or more control circuits are further configured to apply a bad column multiplexing scheme whereby data for a bad column is reassigned to a redundant column without reassignment of data for subsequent columns.

7. The apparatus of claim 6, wherein the one or more control circuits are further configured to, in response to detection of the out-of-order entry, force a pointer directed to the out-of-order entry to advance to a higher entry in the ordered list of bad columns.

8. The apparatus of claim 1, wherein the one or more control circuits are further configured to, in response to detection of the out-of-order entry, generate an output signal indicating that an out-of-order condition has occurred.

9. The apparatus of claim 1, wherein the one or more control circuits are further configured to, in response to detection of the out-of-order entry, save a record of occurrence of an out-of-order condition.

10. The apparatus of claim 1, wherein the plurality of nonvolatile memory cells are monolithically formed in one or more physical levels of arrays of memory cells having an active area disposed above a silicon substrate with the columns extending vertically through the one or more physical levels.

11. A method, comprising:
    accessing an ordered list of column addresses of bad columns of a nonvolatile memory array, the ordered list arranged in order of column addresses of the bad columns;
    comparing an address range of a data access request with one or more entries in the ordered list;
    in response to finding a match between an address of the address range of the data access request and a column address at an entry of the one or more entries in the ordered list, redirecting data access of at least a portion of the data access request; and
    identifying an out-of-order entry in the ordered list by comparing column addresses of a plurality of adjacent entries in the ordered list.

12. The method of claim 11, wherein identifying the out-of-order entry in the ordered list includes comparing a first entry in the ordered list with a subsequent second entry in the ordered list and identifying the first entry in the ordered list as an out-of-order entry if it indicates a column address that is subsequent in order to a column address indicated by the second entry.

13. The method of claim 12 further comprising: in response to identifying the first entry in the ordered list as an out-of-order entry, incrementing a first pointer from the first entry to a third entry that is subsequent to the second entry.

14. The method of claim 11, wherein redirecting data access of at least a portion of the data access request includes skipping the column address by reassigning data of the column address and subsequent column addresses of the address range to incremented column addresses that are incremented by one address.

15. The method of claim 14, further comprising: in response to identifying the out-of-order entry in the ordered list, skipping two columns of the nonvolatile memory array by incrementing column addresses by two addresses at a next entry in the ordered list.

16. The method of claim 11, wherein redirecting data access of at least a portion of the data access request includes reassigning data for the column without reassignment of subsequent data of the data access request.

17. The method of claim 11, wherein the identifying occurs during testing of a the nonvolatile memory array, the method further comprising, in response to identifying the out-of-order entry, saving a record of an out-of-order condition or providing an output signal indicating the out-of-order condition.

18. The method of claim 17, further comprising at least one of sorting the nonvolatile memory array according to the record or the output signal or discarding the nonvolatile memory array according to the record or the output signal.

19. A system comprising:
    means for maintaining an ordered list of bad columns of a nonvolatile memory structure that are replaced by redundant columns of the nonvolatile memory structure;
    means for applying a bad column replacement scheme to the redundant columns in response to receiving data access requests directed to the bad columns; and
    means for identifying an out-of-order entry in the ordered list of bad columns.

20. The system of claim 19 further comprising:
means for generating an output signal in response to detection of the out-of-order entry in the ordered list of bad columns.

* * * * *